(12) United States Patent
Furukawa

(10) Patent No.: US 7,634,750 B2
(45) Date of Patent: Dec. 15, 2009

(54) LOGIC DIAGRAM DISPLAY METHOD, PROGRAM, AND APPARATUS

(75) Inventor: Eiji Furukawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 538 days.

(21) Appl. No.: 11/543,029

(22) Filed: Oct. 5, 2006

(65) Prior Publication Data

US 2008/0005714 A1    Jan. 3, 2008

(30) Foreign Application Priority Data

Jun. 29, 2006    (JP)    ............................. 2006-179016

(51) Int. Cl.
*G06F 17/50*    (2006.01)

(52) U.S. Cl. ................. 716/11; 716/3; 716/18

(58) Field of Classification Search ............ 716/3, 716/8, 9, 11, 18
See application file for complete search history.

(56) References Cited

U.S. PATENT DOCUMENTS

| | | | | |
|---|---|---|---|---|
| 4,656,603 A | * | 4/1987 | Dunn | ......................... 715/835 |
| 5,367,468 A | * | 11/1994 | Fukasawa et al. | ............. 716/11 |
| 5,541,849 A | * | 7/1996 | Rostoker et al. | ............... 716/18 |
| 5,557,774 A | * | 9/1996 | Shimabukuro et al. | ........ 703/21 |
| 5,572,437 A | * | 11/1996 | Rostoker et al. | ............... 716/18 |
| 5,576,965 A | | 11/1996 | Akasaka | |
| 5,610,830 A | * | 3/1997 | Ito et al. | ......................... 716/1 |
| 5,673,198 A | * | 9/1997 | Lawman et al. | ................ 716/11 |

FOREIGN PATENT DOCUMENTS

| | | |
|---|---|---|
| JP | 1-291376 | 11/1989 |
| JP | 5-151307 | 6/1993 |
| JP | 5-242186 | 9/1993 |
| JP | 6-89314 | 3/1994 |

* cited by examiner

*Primary Examiner*—Sun J Lin
(74) *Attorney, Agent, or Firm*—Staas & Halsey LLP

(57) ABSTRACT

In cell retrieval processing, a cell list is acquired from a library, a classification file corresponding to the cell list is read to display a classification screen of setting a cell retrieval condition, and a cell satisfying the retrieval condition set through the classification screen is retrieved from the cell list. In logic diagram rendering processing, a location name described as an instance name in an HDL file is decoded, and a location attribute indicative of a location on the diagram is added to an instance to render a logic diagram. In instance arrangement processing, a location name indicative of an arrangement location on the diagram is set as an instance name for rendering. In instance movement processing, the instance name of an instance is changed to a location name indicative of a specified movement location for rendering. In attribute display processing, attributes of pins and nets are read for display nearby.

31 Claims, 30 Drawing Sheets

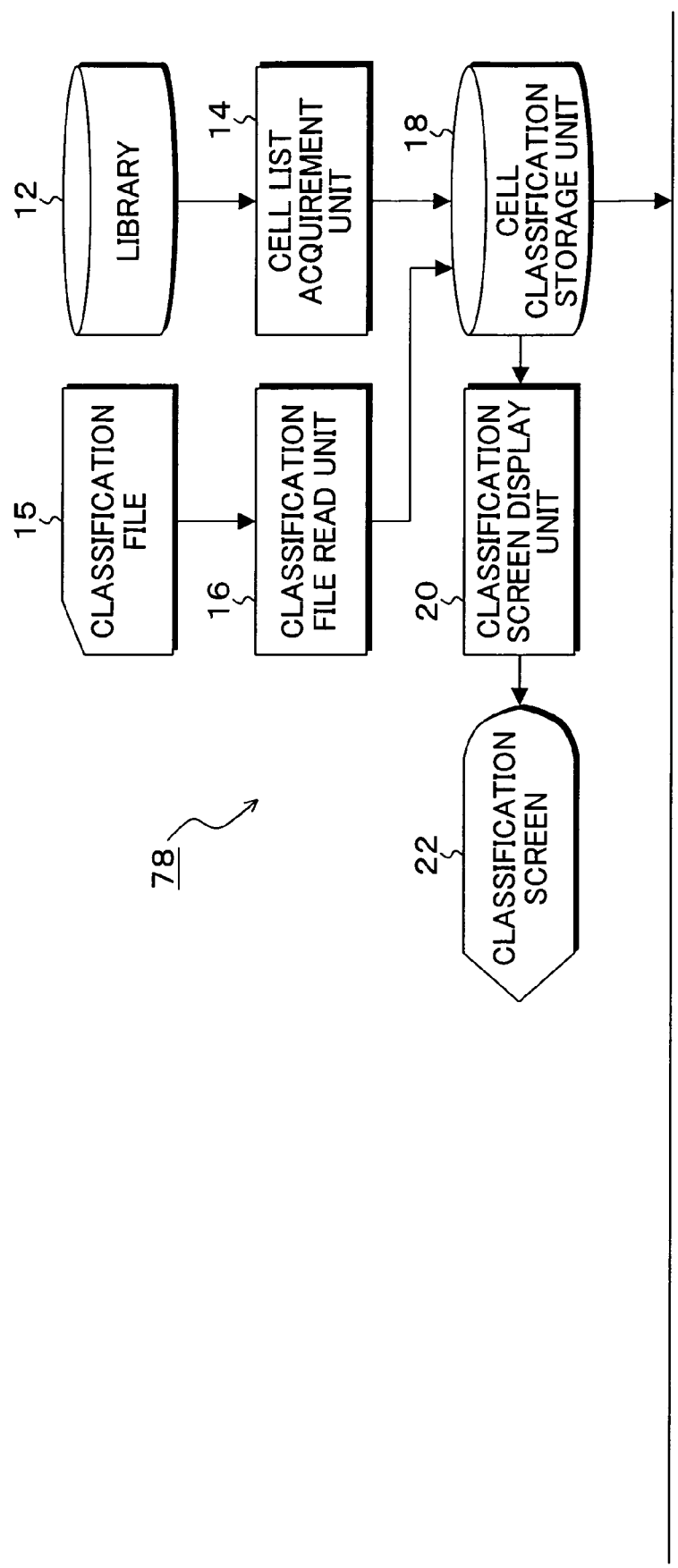

FIG. 7

```
1  set group_type(1) [inv and xor]
2  set group_type(2) [1 2 3]
3  set group_type(3) [a b c]
4  set group_rule(1) {[inv "^ inv.."] [and "^ and.."] [xor "^ xor.."]}
5  set group_rule(2) {[1 "^ ...1."] [2 "^ ...2."] [3 "^ ...3."] }
6  set group_rule(3) {[a "^ ....a"] [b "^ ....b"] [c "^ ....c"] }
```

```
1    module exam1 (in1, in2, in3, out);
2    input in1;
3    input in2;
4    input in3;
5    output out;
6    wire w1;
7    wire w2;
8    inv1a aaa2c (.a(in1), .x(w1)) ;
9    and1a aaa2a (.a1(in2), .a2(in3), x(w2));
10   xor1a aaa4b (.a1(w2), .a2(w1), .x(out));
11   endmodule
```

```
1  module exam2;
2  and1b bbb4a ();
3  endmodule
```

```
1   module exam1 (in1, in2, in3, out);
2   input in1;
3   input in2;
4   input in3;
5   output out;
6   wire w1;
7   wire w2;
8   inv1a aaa2b (.a(in1), .x(w1)) ;
9   and1a aaa2a (.a1(in2), .a2(in3), x(w2));
10  xor1a aaa4b (.a1(w2), .a2(w1), .x(out));
11  endmodule
```

→ 8

LOGIC DIAGRAM DISPLAY METHOD, PROGRAM, AND APPARATUS

This application is a priority based on prior application No. JP 2006-161916, filed Jun. 12, 2006, in Japan.

BACKGROUND OF THE INVENTION

1. Field of the Invention

The present invention relates to logic diagram display methods, programs, and apparatuses in which a text file of a circuit module described in a hardware description language (HDL) is inputted to render a graphical logic diagram on a screen. Particularly, an object of the present invention is to provide a logic diagram display method, program, and apparatus allowing selection of a cell to be arranged on the diagram, rendering of a logic circuit, arrangement and movement of an instance, and appropriate display of attributes of pins and nets.

2. Description of the Related Arts

Conventionally, for a large-sized logic circuit, as a design scheme in place of a circuit diagram, text-based design operations using a hardware description language HDL, such as Verilog-HDL, have been performed. A design operation by the HDL is normally performed according to the following procedure.

(1) Generate an HDL file (function description file) by describing functions of a circuit module on a text editor in a hardware description language.

(2) Confirm the operation by using an HDL simulator of the HDL file.

(3) Generate a net list by using a logic synthesis tool from the HDL file with its operation having been confirmed. In such a design operation using a hardware description language, the following operations are repeated: with the use of a logic diagram display apparatus that reads an HDL file with the function of the circuit module described on a text base and graphically renders a logic circuit on a screen as a design support apparatus, in an in-progress stage in the design operation or a design completion stage, the function-described module is input on the screen to graphically render its logic diagram; on the logic diagram, the contents of the function description is checked; a circuit change or a circuit correction is made as required on the logic diagram; and the checked or corrected logic circuit is then again outputted as an HDL file. Conventional technologies related to the above include, for example, a circuit representation text generation system in Patent Document 1. In this circuit representation text generation system, an interaction is made with an input device while an original text of a circuit representation is displayed on a display screen, thereby setting pin connection information for an unconnected pin described in the original text and generating a circuit representation text. Here, as an instance name (unique name) of a circuit cell to be described in the text, a location (row and column number) on the diagram is used with an association between the cell and the arrangement location.

However, the conventional logic diagram display apparatuses that support a designing operation using a hardware description language have the following problems. First, when an HDL file of a module is inputted to graphically display a logic diagram, if it is desired to newly arrange a certain instance for the logic diagram being rendered, a cell of that instance has to be selected. In the conventional cell selection method, a cell is directly selected from a list of cells stored in a library. If the number of cell types is small, selection is easy. However, the library normally has stored therein as many as several hundreds of cells, thereby posing problems that, since the number of cell types is large, selection is extremely difficult, and erroneous cell selection tends to occur. Also, when an HDL file of a module is inputted to graphically display a logic diagram, data (database), attributes, control data (pragma), and others dedicated to the logic diagram are conventionally required to be inputted apart from the HDL file. The reason for this is that, since a general hardware description language does not have diagram information indicative of arrangement locations on the diagram. When a logic diagram is tried to be rendered with an HDL file as an input, rendering processing is performed under a condition set by an apparatus side, and therefore a logic diagram may not able to be rendered as expected. Moreover, when the HDL file is corrected, rendering processing is performed under a condition set by an apparatus side, thereby posing a problem of making it difficult to render an uncorrected portion always in a same manner. To get around these problems, in the system of Patent Document 1, the location (row and column number) on the diagram is used as the instance name (unique name) of the circuit cell, thereby providing a correspondence between the text and the logic diagram. However, the instance name (unique name) and the location (row and column number) on the diagram can be separately registered. In the case of conversion to a function description file (HDL file) without a location (row and column number), there is a problem that it is not easy to know the original logic diagram from the function description file. Also, in rendering a logic diagram, when an instance is arranged on a diagram, its instance name is specified by a designer or, in the case of no specification, an instance name is automatically provided. Here, the instance means a componentized module in Verilog-HDL, and using a module as a component configuring another module is called instantiation. However, when an HDL file is outputted from the generated logic diagram, the HDL file does not have diagram information, such as diagram arrangement locations, thereby posing a problem that it is not easy to know the original logic diagram from the HDL file. Furthermore, in the case where, after a logic diagram is generated and outputted as an HDL file, a layout design is performed by using a logic synthesis tool to evaluate a slack value of a pin or a wiring length of a net, it is conventionally required to evaluate the slack value and wiring length information on a text base by returning to the HDL file. Therefore, when an HDL file is inputted before layout designing to correct the rendered logic diagram, there is a problem that it is difficult to correct the logic diagram in consideration of the slack value and wiring length information.

SUMMARY OF THE INVENTION

According to the present invention to provide a logic diagram display method, program, and apparatus that allows an easy association between a text-based function description file in a hardware description language and a graphical logic diagram and optimizes cell selection, rendering of a logic diagram from the HDL, arrangement and movement of an instance on the logic diagram, and further evaluation of attributes of pins and nets on the logic diagram.

(Method)

The present invention provides a logic diagram display method. The present invention is directed to a logic diagram display method of displaying a logic diagram on a screen for processing, including:

a logic diagram rendering step of rendering the logic diagram on the screen by inputting a function description file (HDL file) of a circuit module described in a hardware description language (HDL);

a cell retrieval step of retrieving a cell to be arranged on the screen-displayed logic diagram from a library;

an instance arrangement step of arranging on the screen-displayed diagram an instance obtained by componentizing the module;

an instance movement step of moving the screen-displayed instance on the diagram to a specified location; and a file output step of outputting a function description file (HDL file) corresponding to the screen-displayed logic circuit.

Here, the cell retrieval step includes:

a cell list acquirement step of acquiring a cell list from the library;

a classification file read step of reading a classification file corresponding to the cell list;

a classification screen display step of displaying a classification screen of setting a cell retrieval condition based on the classification file; and a cell retrieval step of retrieving from the cell list a cell satisfying the retrieval condition set through the classification screen.

Furthermore, as details of the cell retrieval step, in the cell list acquirement step, a cell list in which a cell name is formed by hierarchically combining a plurality of cell classification items is acquired from the library, in the classification file read step, a classification file including group types obtained by classifying the cell classification items of the cell names by layer and a conditional expression for cell retrieval generated for each of the group type is read, in the classification screen display step, the cell classification items are displayed by each of the group types as the classification screen and a selection operation unit is displayed for each of the cell classification items, and in the cell retrieval step, a plurality of cell classification items selected from the classification screen are set to the conditional expression, and a cell name satisfying the conditional expression is retrieved from the cell list for output.

In the cell retrieval step, a cell name hierarchically including the cell classification items set to the conditional expression for each group type is retrieved from the cell list.

The logic diagram rendering step includes:

a file read step of reading a function description file (HDL file) using a location name as an instance name of the instance;

a location attribute addition step of decoding the location name of the instance and adding a location attribute indicative of a location on the diagram to the instance; and a diagram rendering step of rendering a logic diagram based on the location attribute.

The instance arrangement step includes:

a cell selection step of selecting a cell;

an arrangement location specifying step of specifying an arrangement location of the instance;

a location attribute set step of setting a location attribute of the instance;

a location name set step of setting an instance name as a location name indicative of the specified arrangement location; and a rendering step of rendering the instance at the specified arrangement location.

The instance movement step includes:

an instance selection step of selecting a moving instance;

a movement location specifying step of specifying a movement location of the instance;

a location attribute change step of changing a location attribute of the instance;

an instance name change step of changing an instance name to a location name indicative of the specified movement location; and a rendering step of rendering the instance at the specified movement location.

The location name is represented by alphanumeric characters by combining a page name, a horizontal axis coordinate value, and a vertical axis coordinate value of the diagram for screen display.

The logic diagram display method further includes an attribute display step of reading a slack value file, adding a slack value as an attribute of a pin, and displaying the slack value near the pin; and reading a wiring length file, adding a wiring length as an attribute of a net, and displaying the wiring length near the net.

Another embodiment of the present invention is directed to a logic diagram display method of retrieving a cell to be arranged on a screen-displayed logic diagram from a library, including:

a cell list acquirement step of acquiring a cell list from the library;

a classification file read step of reading a classification file corresponding to the cell list;

a classification screen display step of displaying a classification screen of setting a cell retrieval condition based on the classification file; and a cell retrieval step of retrieving from the cell list a cell satisfying the retrieval condition set through the classification screen.

In more detail, in the cell list acquirement step, a cell list in which a cell name is formed by hierarchically combining a plurality of cell classification items is acquired from the library, in the classification file read step, a classification file including group types obtained by classifying the cell classification items of the cell names by layer and a conditional expression for cell retrieval generated for each of the group type is read, in the classification screen display step, the cell classification items are displayed by each of the group types as the classification screen and a selection operation unit is displayed for each of the cell classification items, and in the cell retrieval step, a plurality of cell classification items selected from the classification screen are set to the conditional expression, and a cell name satisfying the conditional expression is retrieved from the cell list for output.

Still another embodiment of the present invention is directed to a logic diagram display method of inputting a function description file (HDL file) of a circuit module described in a hardware description language and displaying a logic diagram on a screen, including:

a file read step of reading a function description file (HDL file) using a location name as an instance name of an instance obtained by componentizing the module;

a location attribute addition step of decoding the location name of the instance and adding a location attribute indicative of a location on the diagram to the instance; and a diagram rendering step of rendering a logic diagram based on the location attribute.

Still another embodiment of the present invention is directed to a logic diagram display method of arranging an instance obtained by componentizing a module and rendering a logic diagram on a screen-display diagram, including:

a cell selection step of selecting a cell;

an arrangement location specifying step of specifying an arrangement location of the instance;

a location attribute set step of setting a location attribute of the instance;

a location name set step of setting an instance name as a location name indicative of the specified arrangement location; and a rendering step of rendering the instance at the specified arrangement location.

In this case, the method further includes:

an instance selection step of selecting a moving instance;

a movement location specifying step of specifying a movement location of the instance;

a location attribute change step of changing a location attribute of the instance;

an instance name change step of changing an instance name to a location name indicative of the specified movement location; and a rendering step of rendering the instance at the specified movement location.

(Program)

The present invention provides a program for displaying a logic diagram. The program of the present invention is directed to a program causing a computer to execute:

a logic diagram rendering step of rendering the logic diagram on the screen by inputting a function description file (HDL file) of a circuit module described in a hardware description language (HDL);

a cell retrieval step of retrieving a cell to be arranged on the screen-displayed logic diagram from a library;

an instance arrangement step of arranging on the screen-displayed diagram an instance obtained by componentizing the module;

an instance movement step of moving the screen-displayed instance on the diagram to a specified location; and a file output step of outputting a function description file (HDL file) corresponding to the screen-displayed logic circuit.

(Apparatus)

The present invention provides a logic diagram display apparatus. The present invention is directed to a logic diagram display apparatus in which a logic diagram is displayed on a screen for processing, including:

a logic diagram rendering unit that renders the logic diagram on the screen by inputting a function description file (HDL file) of a circuit module described in a hardware description language (HDL);

a cell retrieval unit that retrieves a cell to be arranged on the screen-displayed logic diagram from a library;

an instance arrangement unit that arranges on the screen-displayed diagram an instance obtained by componentizing the module;

an instance movement unit that moves the screen-displayed instance on the diagram to a specified location; and a file output unit that outputs a function description file (HDL file) corresponding to the screen-displayed logic circuit.

According to the present invention, the following effects can be achieved.

First, when a cell to be arranged on a diagram displayed on a screen is selected, cell classification items hierarchically displayed on a classification screen based on a classification file are selected to determine a retrieval condition, and a matching cell can be retrieved and displayed from a cell list of a library. By narrowing down cell alternatives, even if the number of cell types is large as many as several hundreds, a cell can be simply and easily selected to generate a logic diagram. Also, its classification file is not fixed, with customization by the designer for each design type, cell selection suitable for the design type can be possible.

Also, when an HDL file (function description file) is read to render a logic diagram, the location name indicative of the arrangement location on the diagram is used as the instance name. With this, without requiring reading of dedicated data (database), attributes, control data (pragma), and others apart from the HDL file, a location attribute can be generated from the instance name for arrangement on the diagram.

Also, even if a correction is made on the HDL file, the location names being used as the instance names for uncorrected portions are not changed. Therefore, the uncorrected portions can be always rendered in the same manner as that before correction.

Furthermore, when an instance is arranged or moved on a diagram, its location name is automatically used as the instance name, thereby omitting an operation of specifying an instance name. Still further, when an HDL file is outputted from the logic diagram, it is easy to establish an association of the original logic diagram from the HDL file.

Still further, when a logic diagram is rendered, an attribute file for slack values of pins, net wiring length, and others can be read and attributes, such as the slack values and wiring length values, can be displayed. With this display of the attributes, the designer can appropriately correct the logic diagram in consideration of restrictions on layout design and others. The above and other objects, features, and advantages of the present invention will become more apparent from the following detailed description with reference to the drawings.

BRIEF DESCRIPTION OF THE DRAWINGS

FIGS. 4A and 4B are block diagrams of a function configuration operating as a cell retrieval processing unit in the embodiment;

FIG. 7 is an explanatory diagram of a classification file in FIGS. 4A and 4B;

FIG. 12 is an explanatory diagram of an HDL file in FIGS. 10A and 10B;

FIG. 19 is an explanatory diagram of the HDL outputted after instance movement processing;

DETAILED DESCRIPTION OF THE PREFERRED EMBODIMENTS

Figure 1A:
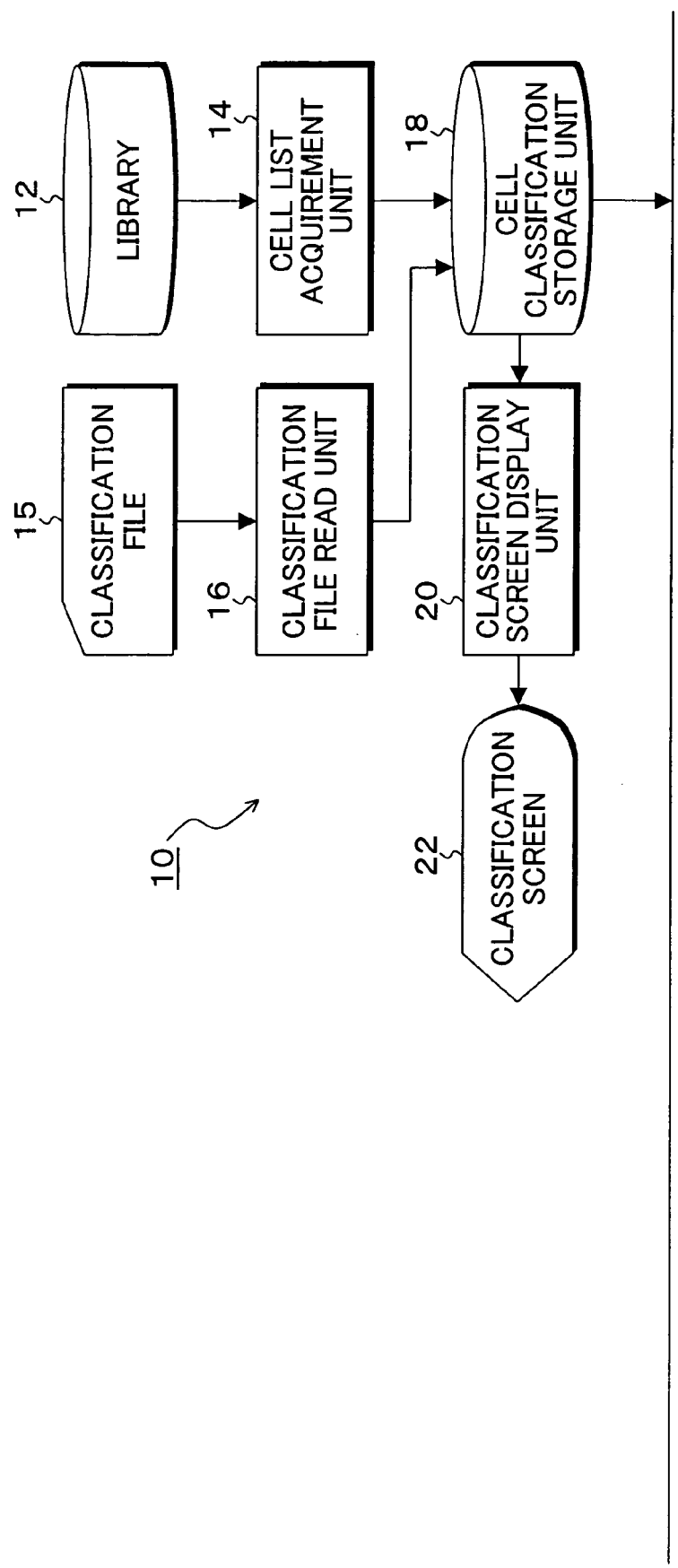
FIGS. 1A and 1B are block diagrams of a function configuration showing an embodiment of a logic diagram display apparatus according to the present invention.
Figure 1B:
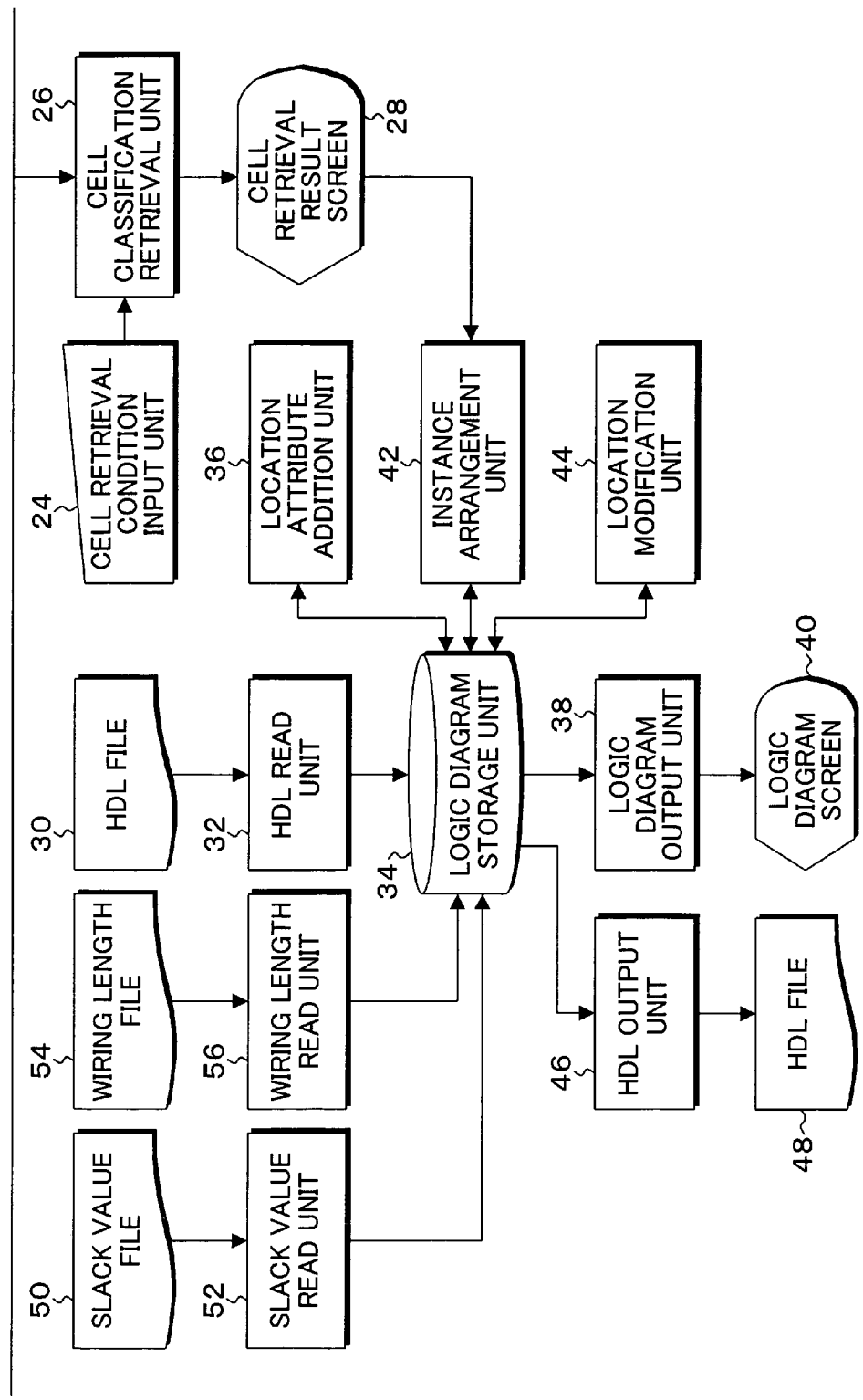

FIGS. 1A and 1B are block diagrams of a function configuration showing an embodiment of a logic diagram display apparatus according to the present invention. In FIGS. 1A and 1B, a logic diagram display apparatus 10 according to the present invention includes the following four functions:

(1) Cell retrieval processing function;
(2) Logic diagram rendering processing function;
(3) Instance arrangement processing function; and
(4) Attribute display function.

Figure 4B:
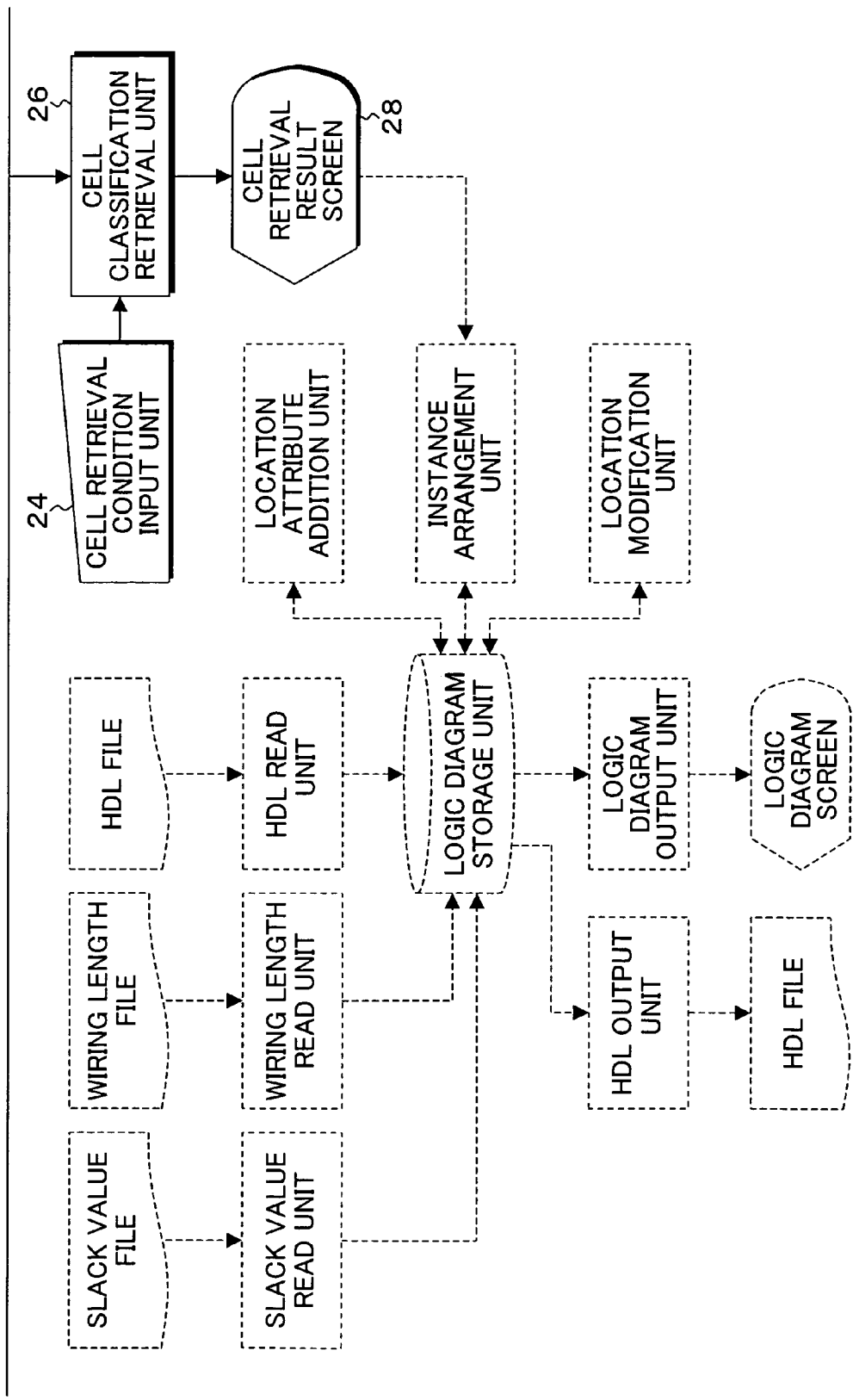
Figure 10A:
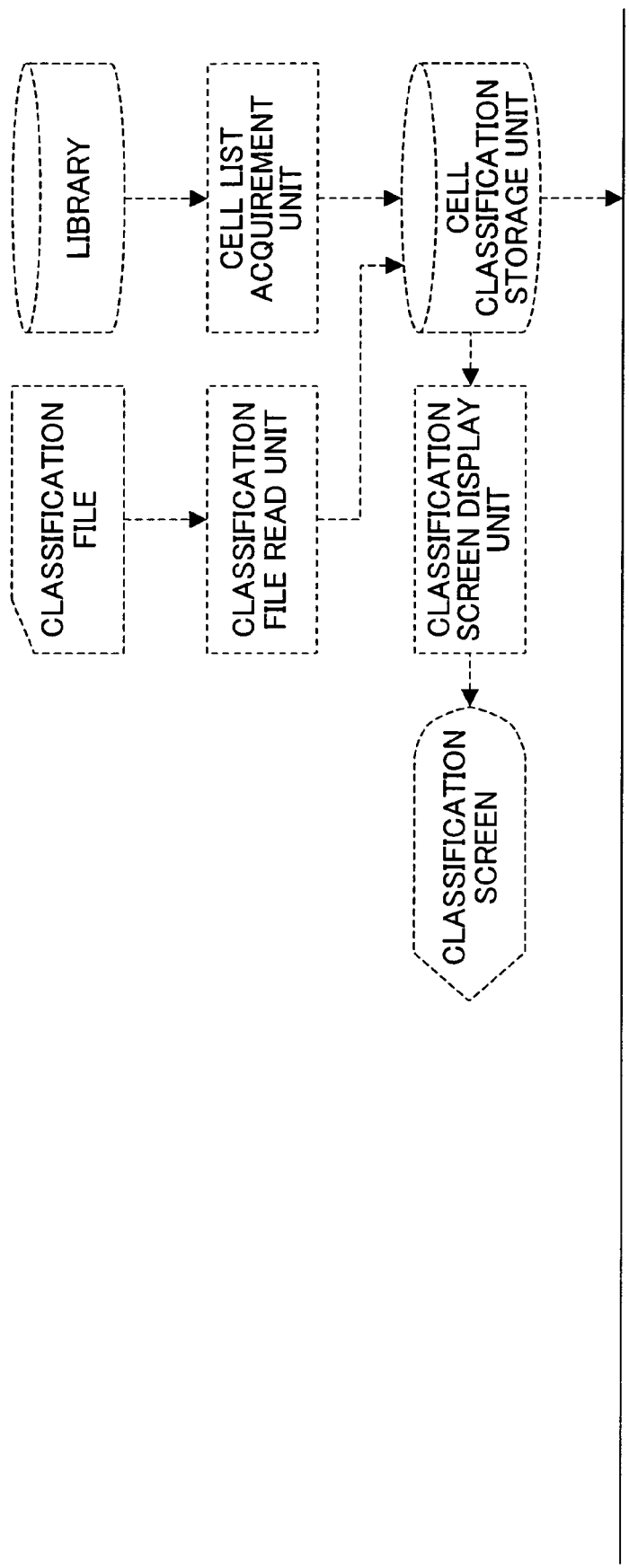
FIGS. 10A and 10B are block diagrams of function configuration operating as a logic diagram rendering processing unit in the embodiment.
Figure 10B:
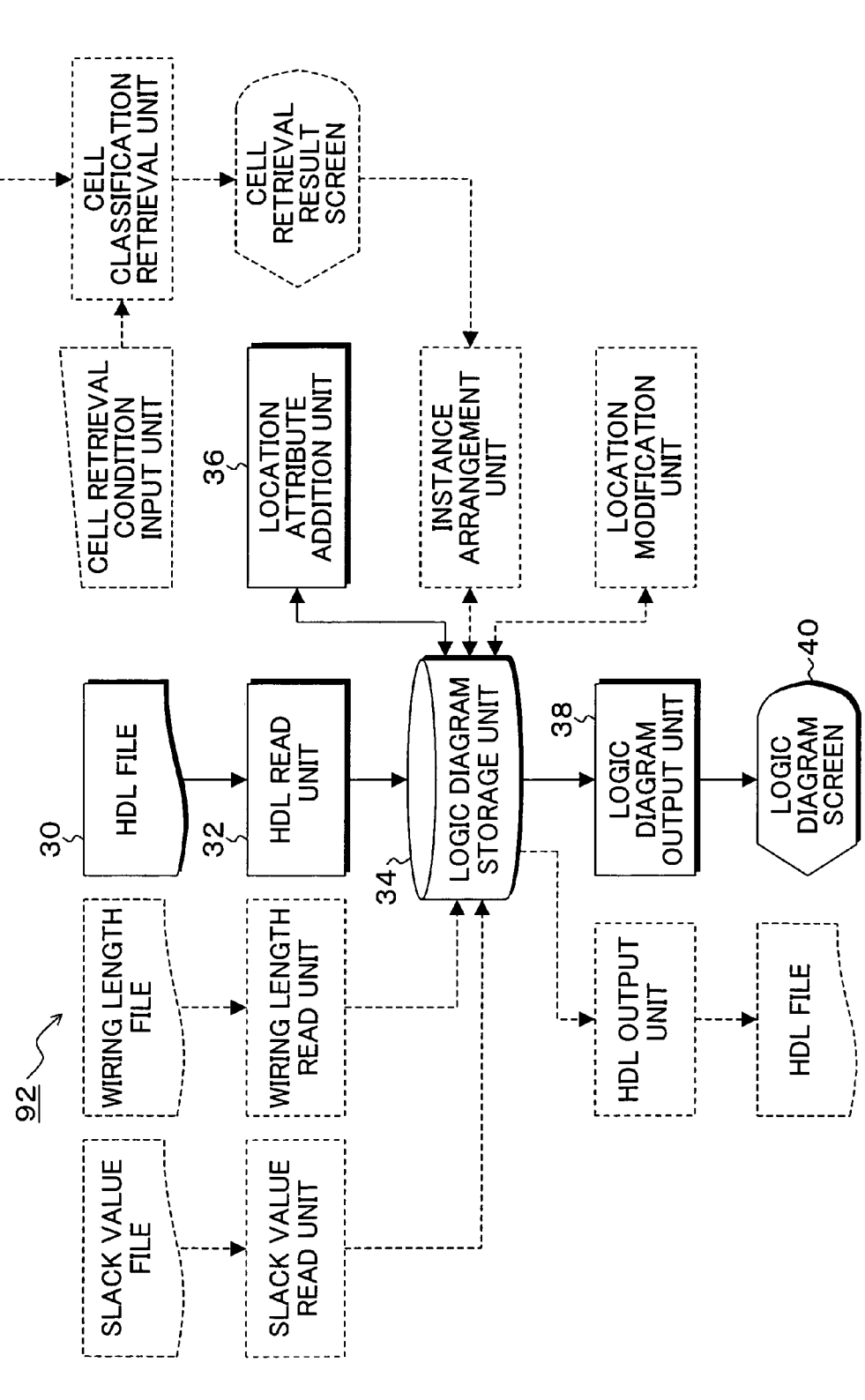
Figure 14A:
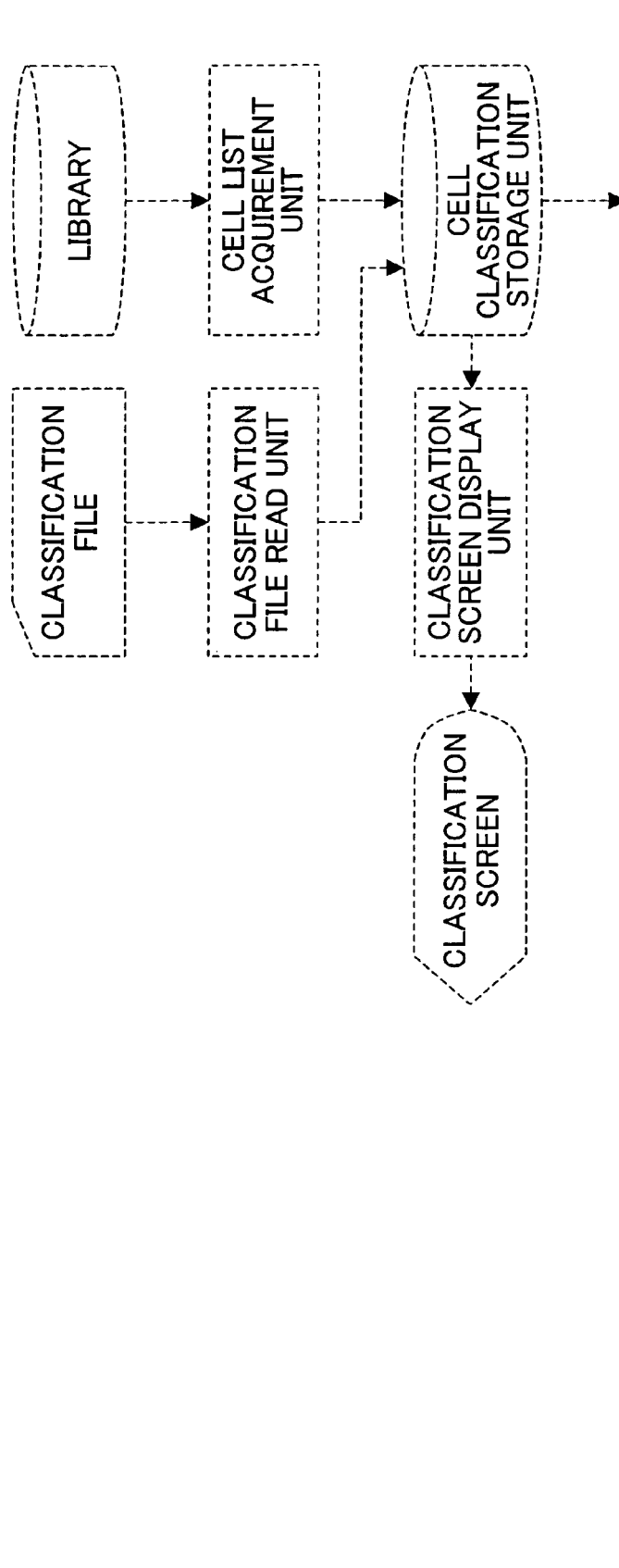
FIGS. 14A and 14B are block diagrams of a function configuration operating as an instance arrangement processing unit in the embodiment.
Figure 14B:
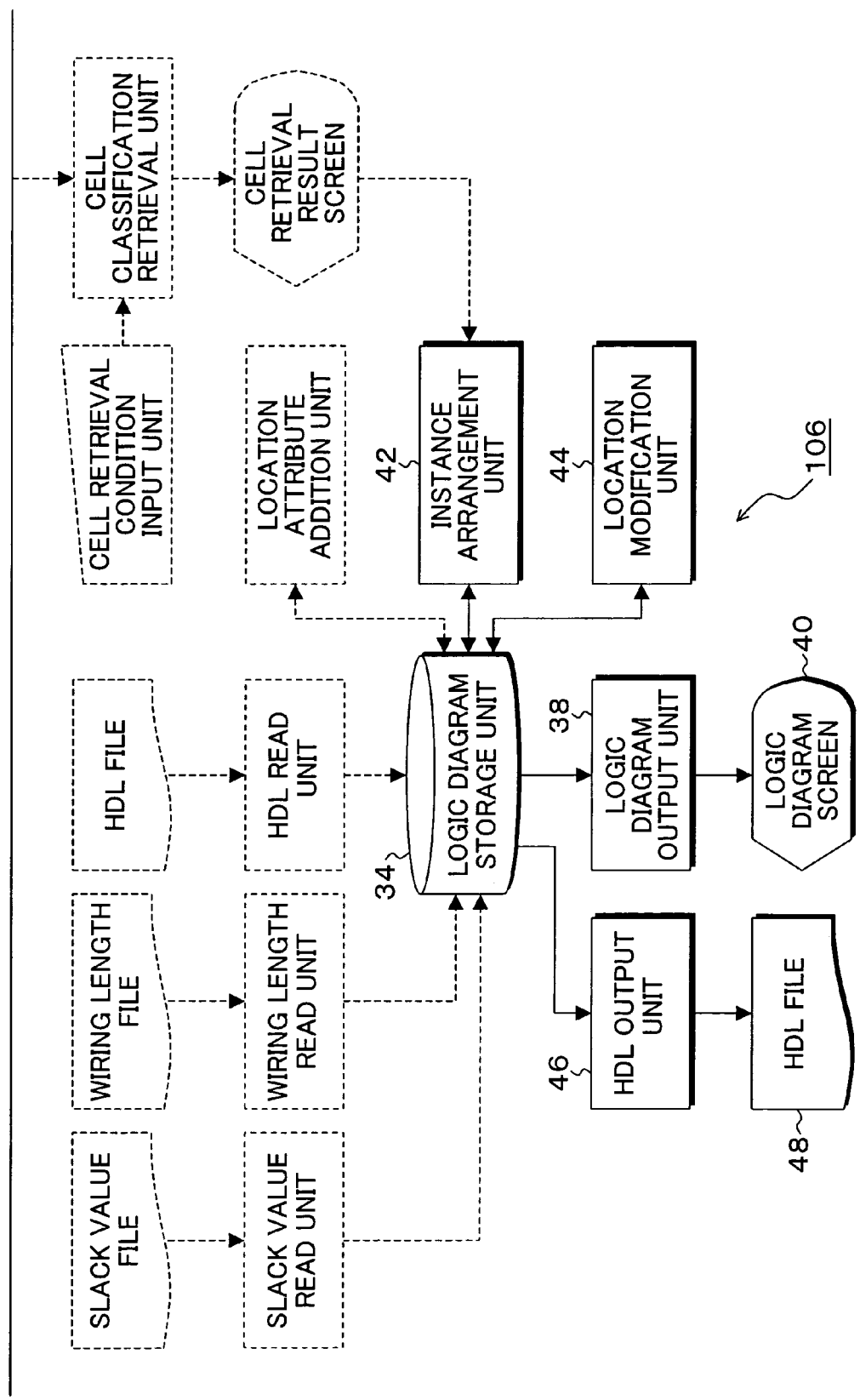
Figure 20A:
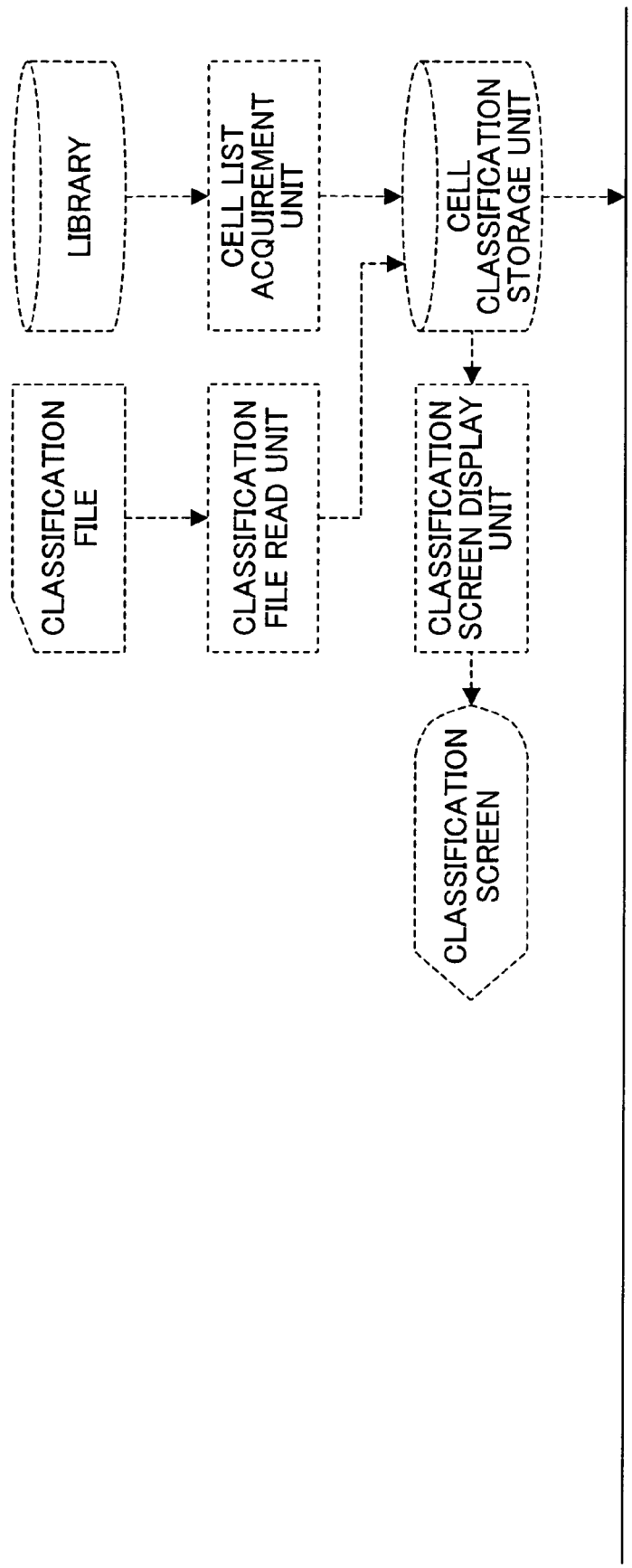
FIGS. 20A and 20B are block diagrams of a function configuration operating as an attribute display unit in the embodiment.
Figure 20B:
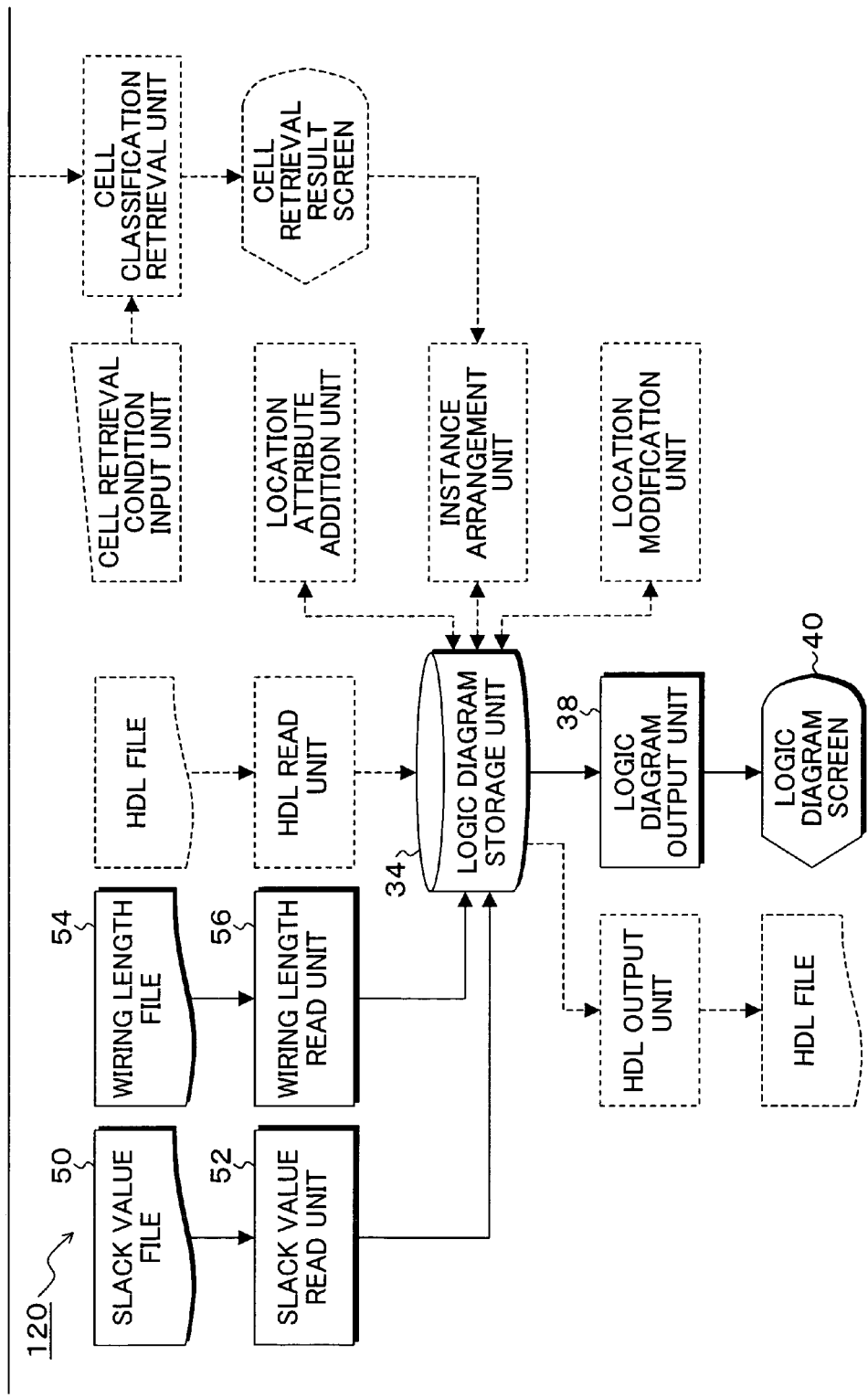

These four processing functions are configured of the following blocks. First, the cell retrieval processing function of (1) is configured of a library 12, a cell list acquirement unit 14, a classification file 15, a classification file read unit 16, a cell classification storage unit 18, a classification screen display unit 20, a classification screen 22, a cell retrieval condition input unit 24, a cell retrieval unit 26, and a cell retrieval result screen 28. This cell retrieval processing function is represented in FIGS. 4A and 4B by solid-lined blocks operating at the time of cell retrieval processing, configuring a cell retrieval processing unit 78. Here, blocks represented by broken lines are portions not operating at the time of cell retrieval processing. Next, the logic diagram rendering processing function of (2) is configured of a function description file (HDL file) 30, an HDL read unit 32, a logic diagram storage unit 34, a location attribute addition unit 36, a logic diagram output unit 38, and a logic diagram screen 40. This logic diagram rendering processing function is represented in FIGS. 10A and 10B by solid-lined blocks operating at the time of logic diagram rendering processing, configuring a logic diagram rendering processing unit 92. Also, the instance arrangement processing function of (3) is configured of the logic diagram storage unit 34, the logic diagram output unit 38, and the logic diagram screen 40, an instance arrangement unit 42, a location change unit 44, an HDL output unit 46, and a functional description file (HDL file) 48. This instance arrangement processing function is represented in FIGS. 14A and 14B by solid-lined blocks operating at the time of instance arrangement processing, configuring an instance arrangement processing unit 106. Furthermore, the attribute display processing function of (4) is configured of the logic diagram storage unit 34, the logic diagram output unit 38, the logic diagram screen 40, a slack value file 50, a slack value read unit 52, a wiring length file 54, and a wiring length read unit 56. This attribute display processing function is represented in FIGS. 20A and 20B by solid-lined blocks operating at the time of attribute display processing, configuring an attribute display processing unit 120.

Figure 2:
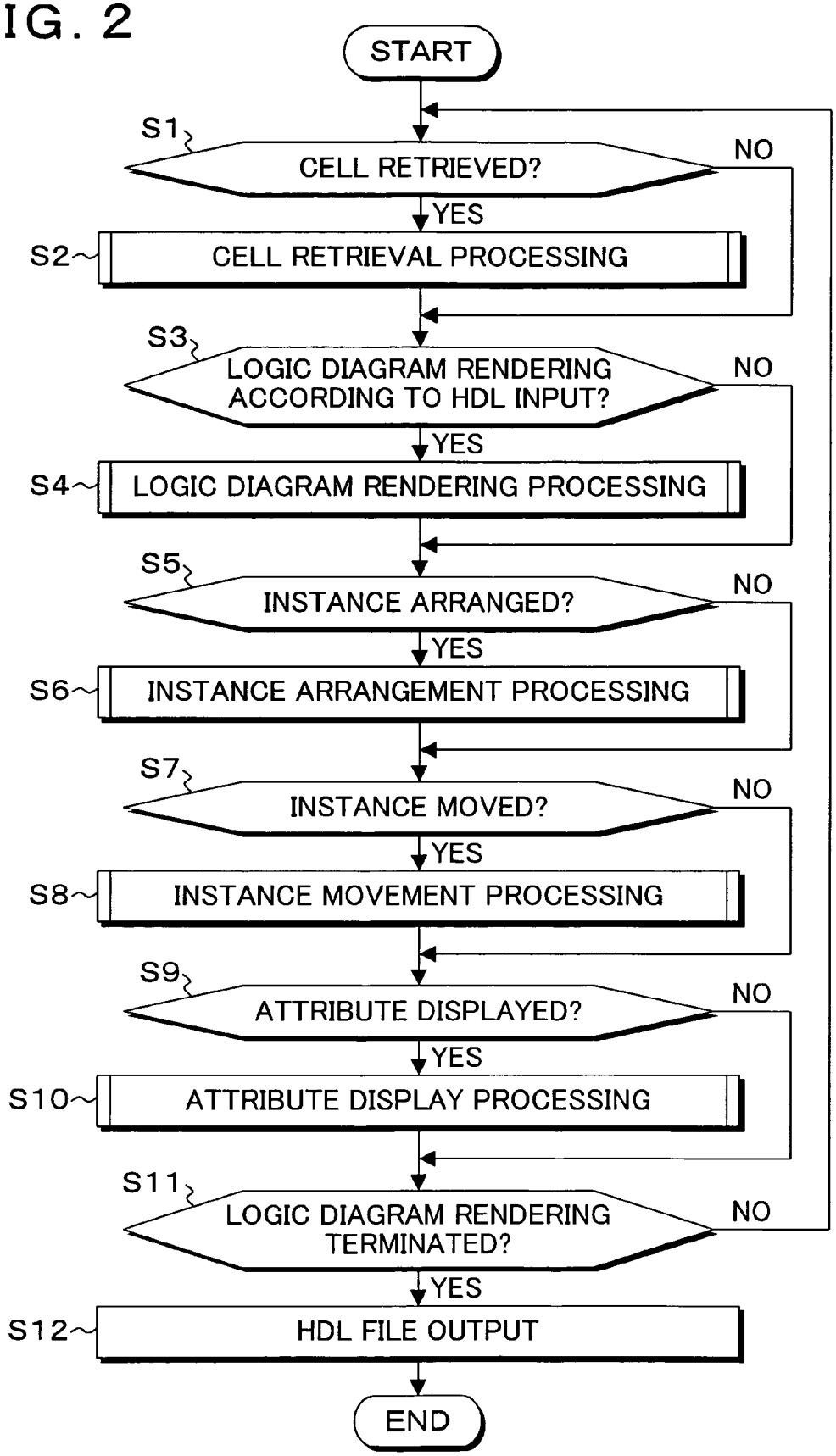
FIG. 2 is a flowchart of logic diagram display processing according to the embodiment.

FIG. 2 is a flowchart of the entire logic diagram display processing according to the embodiment. In FIG. 2, when cell selection is determined in step S1 based on an operation of a menu screen or the like, cell retrieval processing is performed in step S2. Also, when logic diagram rendering through HDL input is determined in step S3 based on the screen menu or the like, logic diagram rendering processing is performed in step S4. Furthermore, when instance arrangement is determined in step S5 based on the screen menu or the like, instance arrangement processing is performed in step S6. Still further, when instance movement is determined in step S7 based on the menu screen or the like, instance movement processing is performed in step S8. Still further, when attribute display is determined in step S9 based on the menu screen or the like, attribute display processing is performed in step S10. In such processing from steps S1 to S10 of displaying the logic diagram on the screen based on reading of the HDL file for change, correction, and the like, when it is determined in step S11 that logic diagram designing is terminated, the procedure goes to step S12, where a corresponding HDL file is outputted from the processed logic diagram.

Figure 3:
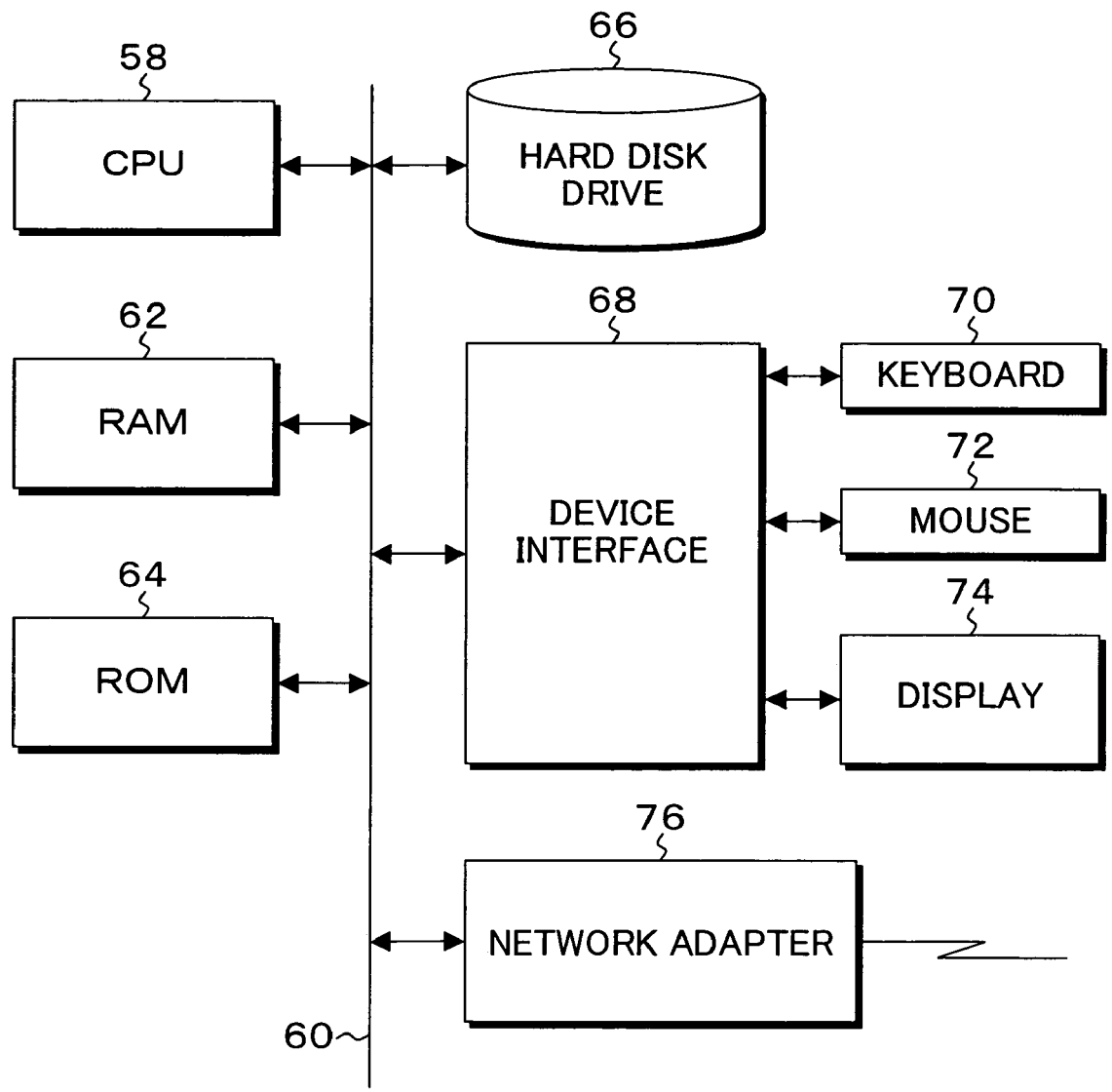
FIG. 3 is a block diagram of a hardware environment of a computer where the function configuration in FIGS. 1A and 1B are realized.

FIG. 3 is a block diagram of a hardware environment of a computer where the function configuration in FIGS. 1A and 1B are realized. In FIG. 3, a bus 60 of a CPU 58 has thereto a RAM 62, a ROM 64, a hard disk drive 66, a device interface 68 having connected thereto a keyboard 70, a mouse 72, and a display 74, and further a network adaptor 76. In the hard disk drive 66, a program that executes the logic diagram display processing of the present embodiment is installed. Upon startup of the computer, after reading of an OS to the RAM 62 after boot, the program for logic diagram display is read into the RAM 62 as an application program, and is then executed by the CPU 58.

FIGS. 4A and 4B are block diagrams of a function configuration operating as the cell retrieval processing unit 78 in the embodiment, where the blocks functioning as the cell retrieval processing unit 78 are represented by solid lines, while other blocks are represented by broken lines. The cell retrieval processing unit 78 is configured of the cell list acquirement unit 14, the classification file read unit 16, the cell classification storage unit 18, the classification screen display unit 20, and the cell retrieval unit 26. The cell list acquirement unit 14 acquires a cell list from the library 12 for storage in the cell classification storage unit 18. The classification file read unit 16 reads the classification file 15 corresponding to the cell list acquired by the cell list acquirement unit 14 from the library 12 for storage in the cell classification storage unit 18. The classification screen display unit 20 displays the classification screen 22 based on the classification file stored in the cell classification storage unit 18. The cell retrieval unit 26 retrieves, based on a retrieval condition set by the cell retrieval condition input unit 24 using the classification screen 22, cells that match the retrieval condition from the cell list stored in the cell classification storage unit 18, and displays the cell on the cell retrieval result screen 28.

Figure 5:
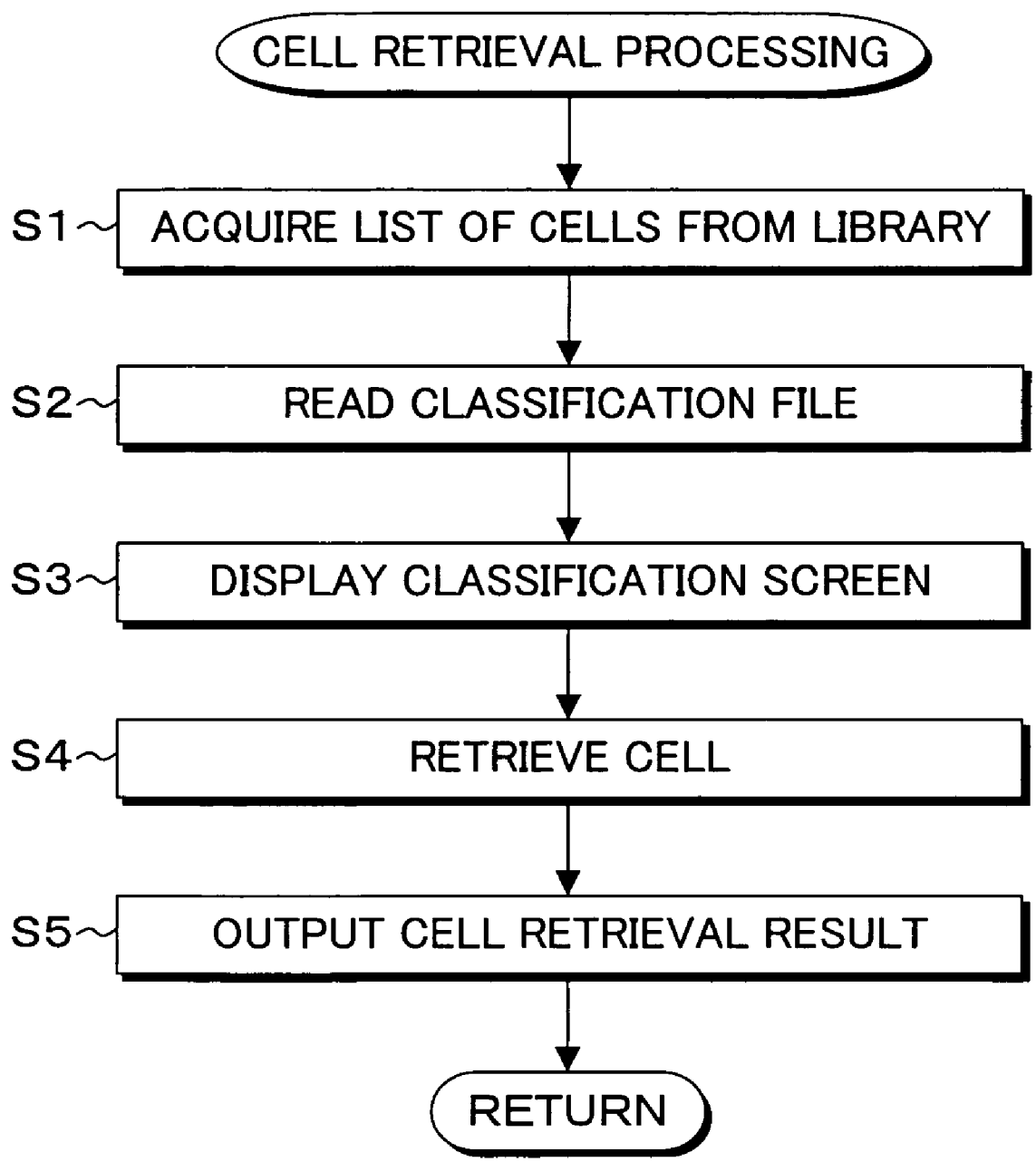
FIG. 5 is a flowchart of cell retrieval processing according to the embodiment.

FIG. 5 is a flowchart of the cell retrieval processing according to the embodiment, representing details in step S2 of FIG. 2, and is described with reference to FIGS. 4A and 4B as follows. First in step S1, a cell list is acquired by the cell list acquirement unit 14 from the library 12, and is stored in the cell classification storage unit 18. Next in step S2, the classification file 15 is acquired by the classification file read unit 16, and is stored in the cell classification storage unit 18. Next in step S3, the classification screen 22 is displayed by the classification screen display unit 20 based on the classification file stored in the cell classification storage unit 18. Then in step S4, the cell retrieval unit 26 uses the cell retrieval condition set by the cell retrieval condition input unit 24 using the classification screen 22 to retrieve cells that match the retrieval condition from the cell list stored in the cell classification storage unit 18. Then in step S5, the retrieval result is displayed and outputted on the cell retrieval result screen 28. Such cell retrieval processing is described in further detail as follows.

Figure 6:
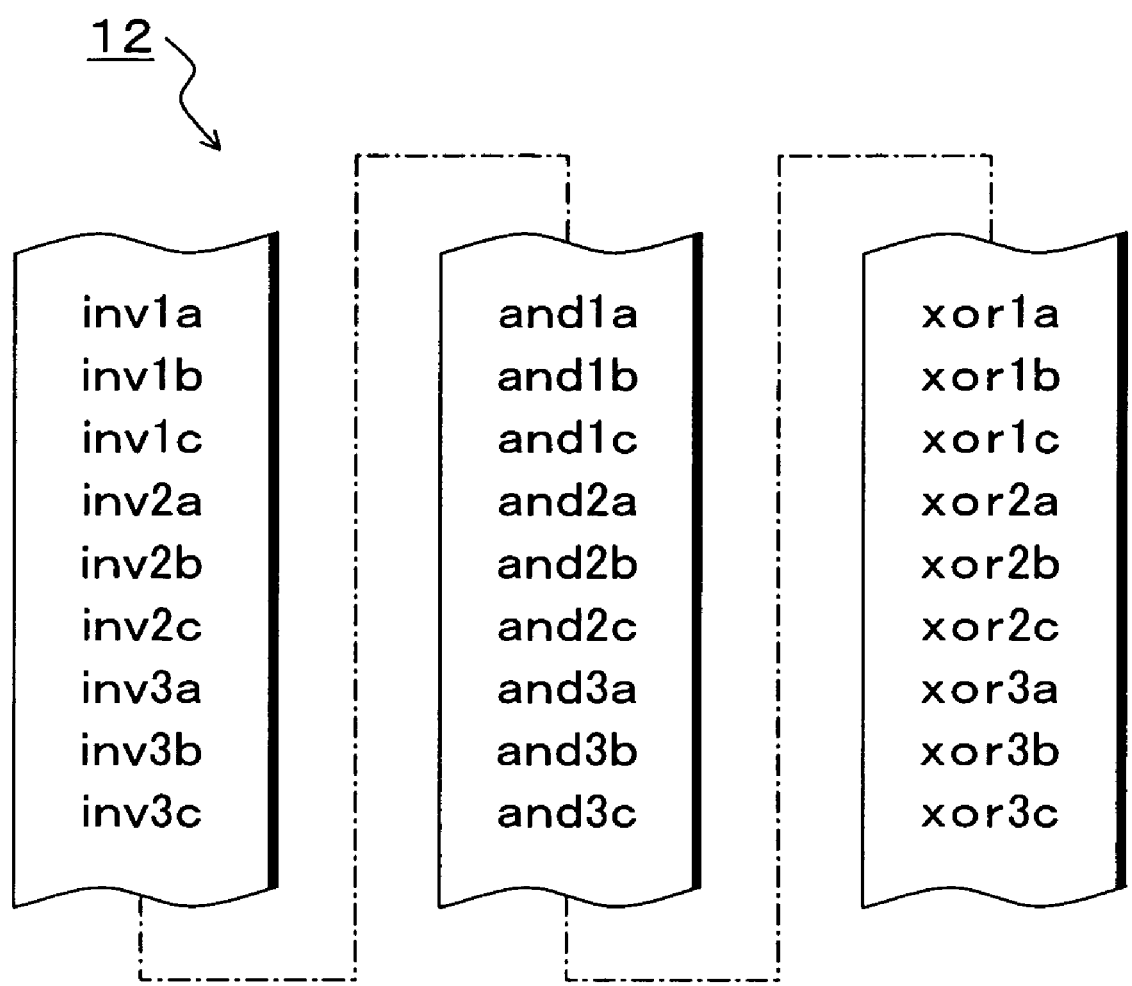
FIG. 6 is an explanatory diagram of a library in FIGS. 4A and 4B.

FIG. 6 depicts an example of the library 12 in FIGS. 4A and 4B. In the library 12, a list of cell names having a hierarchical classification configuration is stored. A cell name having this hierarchical configuration, such as a head cell name of "inv1a" being taken as an example, is formed of a combination of classification items of three layers, that is, a combination of three classification items of:

First classification item=inv,
Second classification item=1, and
Third classification item=a.

As a matter of course, this cell name is merely an example, and cell names and classification items with an appropriate number of layers can be used as required. The cell list stored in the library 12 is stored in the cell list acquirement unit 14 of FIGS. 4A and 4B as the following cell list.

set cell_list {inv1$a$ inv1$b$ inv1$c$ inv2$a$ inv2$b$ inv2$c$ inv3$a$ inv3$b$ inv3$c$ and1$a$ and1$b$ and1$c$ and2$a$ and2$b$ and2$c$ and3$a$ and3$b$ and3$c$ xor1$a$ xor1$b$ xor1$c$ xor2$a$ xor2$b$ xor2$c$ xor3$a$ xor3$b$ xor3$c$}

Next, in step S2 of FIG. 5, the classification file 15 is read by the classification file read unit 16 into the cell classification storage unit 18. It is assumed that, as the classification file 15, the classification file 15 having a content shown in FIG. 7 is read, for example. The classification file 15 is configured of group types 15-1 in first to third rows and conditional expressions 15-2 based on a regular expression in fourth to sixth rows. In the group types 15-1, the classification items, that is, the classification items of three layers of the cell names in the library 12 shown in FIG. 6, are grouped as a group type (1), a group type (2), and a group type (3). In the conditional expressions 15-2 based on a regular expression, group roles (1) to (3) are generated correspondingly to the group types (1) to (3). Here, when the fourth row is taken as an example of the conditional expression based on a regular expression, a conditional description of {inv"^inv . . "} means the following:
"^" specifies that "inv" starts at the head, and
". . " specifies that the fourth and fifth characters are formed of two characters.

Therefore, {inv"^inv . . "} indicates a condition of "the character starting at the head is inv and two characters form the fourth and fifth characters".

Figure 8:
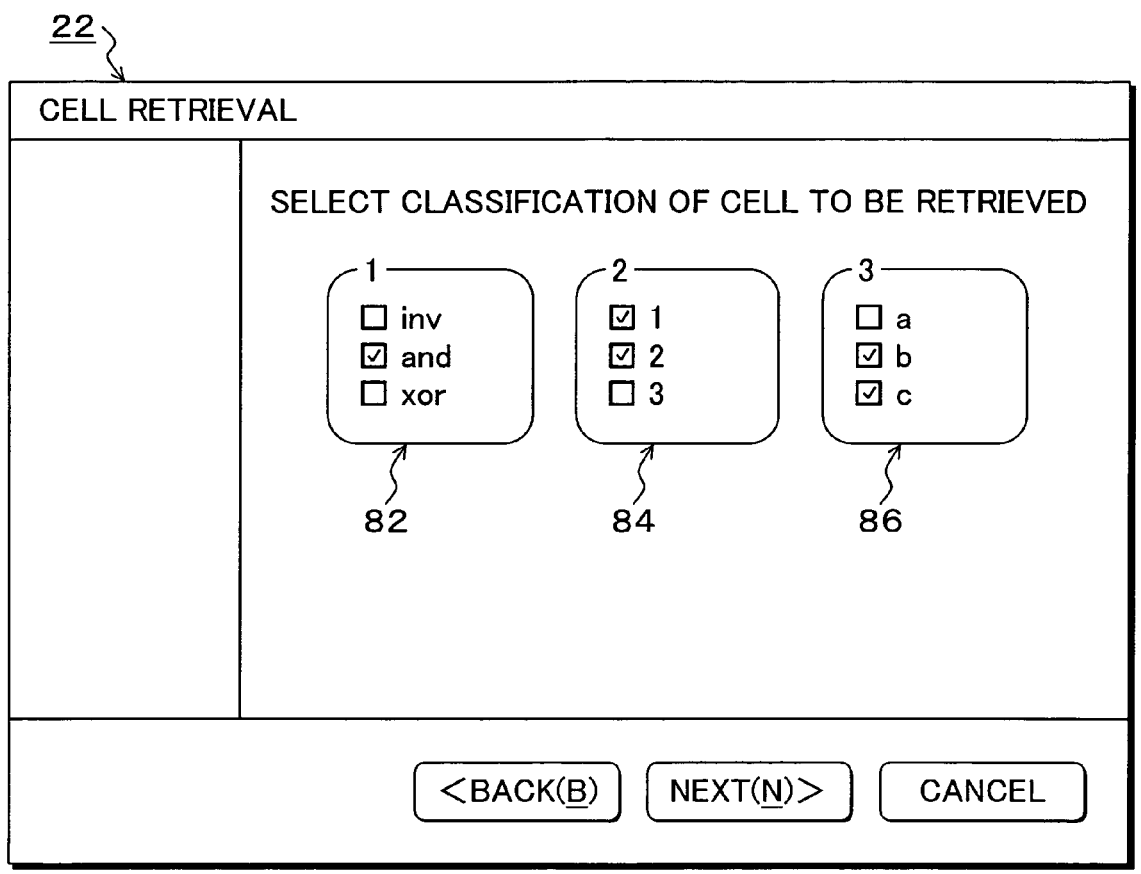
FIG. 8 is an explanatory diagram of a classification screen in FIGS. 4A and 4B.

Next, in step S3 of FIG. 5, based on the classification file 15 of FIG. 7 read by the classification screen display unit 20 of FIGS. 4A and 4B into the cell classification storage unit 18, the classification screen 22 shown in FIG. 8 is displayed.

In FIG. 8, the classification screen 22 has displayed thereon group frames 82, 84, and 86 for group types (1) to (3), respectively, and each of the group frames 82, 84, and 86 has classification items in each group type, together with check boxes for selection. When such a classification screen 22 is displayed, a classification item of a required cell is checked by the cell retrieval condition input unit 24 of FIGS. 4A and 4B using a mouse or the like. In this example, a classification item of "and" in the group type (1), a classification item of "1" in the group type (2), and classification items of "b" and "c" in the group type (3) are checked so as to indicate selection of each classification item. When a retrieval condition is inputted in the above-described manner by selection of classification items by using the classification screen 22, the cell retrieval unit 26 uses the condition expression 15-2 based on a regular expression set in the classification file 15 of FIG. 7 to retrieve cell names that match the retrieval condition from the cell list acquired by cell list reading. This cell retrieval processing is performed as follows.

(1) Retrieval by a conditional expression of "group_rule (1)"

The cell list is processed so that cell names that match a conditional expression of "group_rule (1)" based on a regular expression corresponding to the classification item of "and" checked in the group type (1) shown in the group frame 82 of FIG. 8. In this case, since the classification item of "and" is checked, cell names that match "^and . . " are left. The cell list in this case is thus as follows:

set cell_list {and1$a$ and1$b$ and1$c$ and2$a$ and2$b$ and2$c$ and3$a$ and3$b$ and3$c$}

(2) Retrieval by a conditional expression of "group_rule (2)"

The cell list is processed so that cell names that match a conditional expression of "group_rule (2)" based on a regular expression corresponding to the classification items of "1" and "2" checked in the group frame 84 of FIG. 8. In this case, since the classification items of "1" and "2" are checked, the cell list is processed so that cell names that match "^ . . . 1." and "^ . . . 2." are left. The cell list in this case is thus as follows:

set cell_list {and1$a$ and1$b$ and1$c$ and2$a$ and2$b$ and2$c$}

(3) Retrieval by a conditional expression of "group_rule (3)"

Then, the cell list is processed so that cell names that match a conditional expression of "group_rule (3)" based on a regular expression corresponding to the classification items of "b" and "c" checked in the group frame 86 of FIG. 8. In this case, since the classification items of "b" and "c" are checked, the cell list is processed so that cell names that match "^ . . . b" and "^ . . . c" are left. The cell list in this case is thus as follows:

set cell_list {and1$b$ and1$c$ and2$b$ and2$c$}

Figure 9:
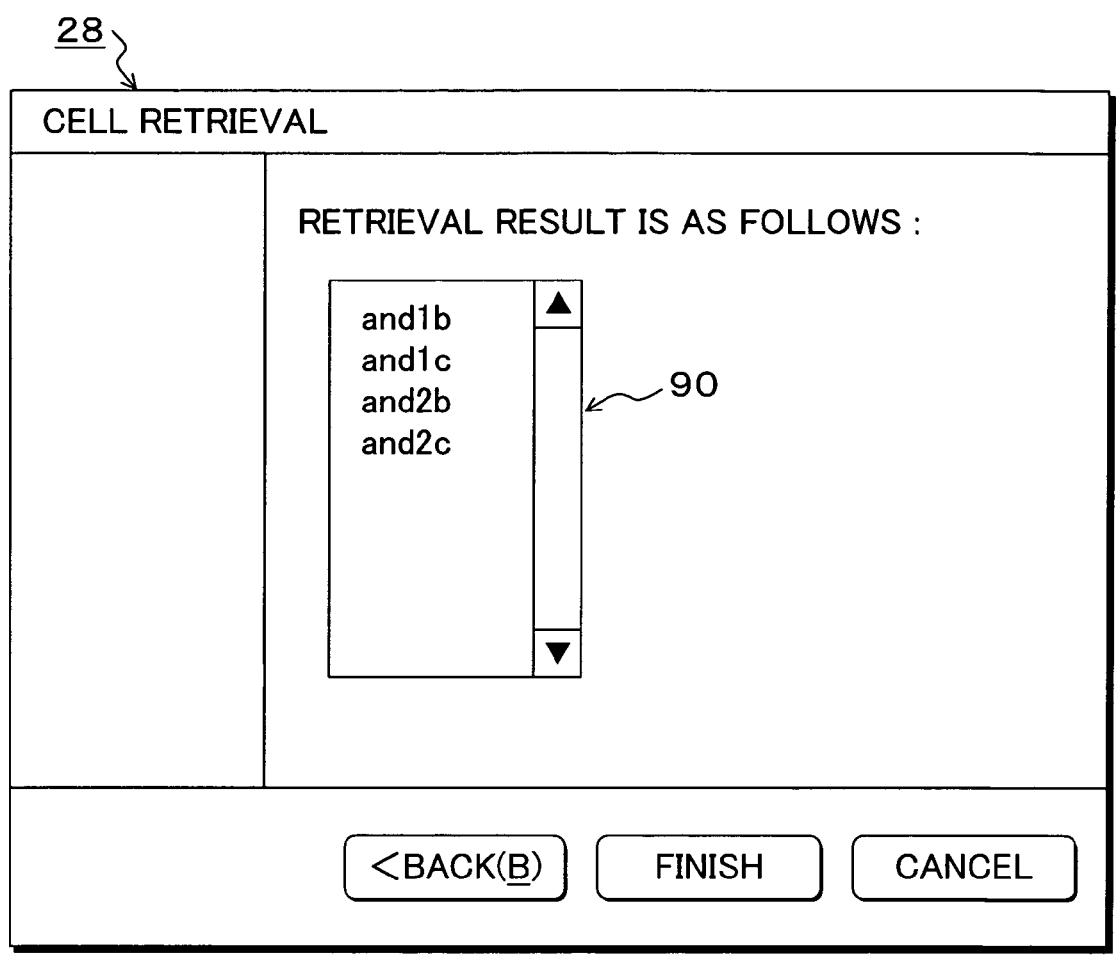
FIG. 9 is an explanatory diagram of a cell retrieval result screen in FIGS. 4A and 4B.

The cell list of "cell_list" left through the three-step retrieval processing from (1) to (3) is displayed as shown in FIG. 9 on the retrieval result screen 28 as the cell retrieval result 90. As a result, from the cell list of the library 12 shown in FIG. 6, targets can be narrowed down to the four cells of the cell retrieval result 90 displayed on the cell retrieval result screen 28 in FIG. 9 through the retrieval processing of the present embodiment, thereby making it possible to simply and easily perform an operation of generating a logic diagram with cells selected from the library. Also, the classification file 15 shown in FIG. 7 can be customized by a designer for each design type, thereby making it possible to retrieve cells suitable for the design type at that moment.

FIGS. 10A and 10B are block diagrams of a function configuration operating as the logic diagram rendering processing unit 92 in the embodiment, where operating block portions are represented by solid lines, while other portions are represented by broken lines. In FIGS. 10A and 10B, the logic diagram rendering processing unit 92 is configured of the HDL read unit 32, the logic diagram storage unit 34, the location attribute addition unit 36, and the logic diagram output unit 38. The HDL read unit 32 reads the HDL file 30 for storage in the logic diagram storage unit 34. As an instance name of an instance configuring a module whose function description is made in HDL, arbitrary alphanumeric characters can be used in normal HDL. However, in the present embodiment, an instance name is described according to a rule defined so as to be a symbol string of alphanumeric characters corresponding to a page name, and a horizontal axis coordinate value and a vertical axis coordinate value on the diagram. The location attribute addition unit 36 decodes a location name of an instance described in the HDL file 30 read into the HDL read unit 32, and adds a location attribute indicative of a location on the diagram to the instance. The logic diagram output unit 38 rendering a logic diagram on the logic diagram screen 40 based on the location attribute of the instance added to the location attribute addition unit 36.

Figure 11:
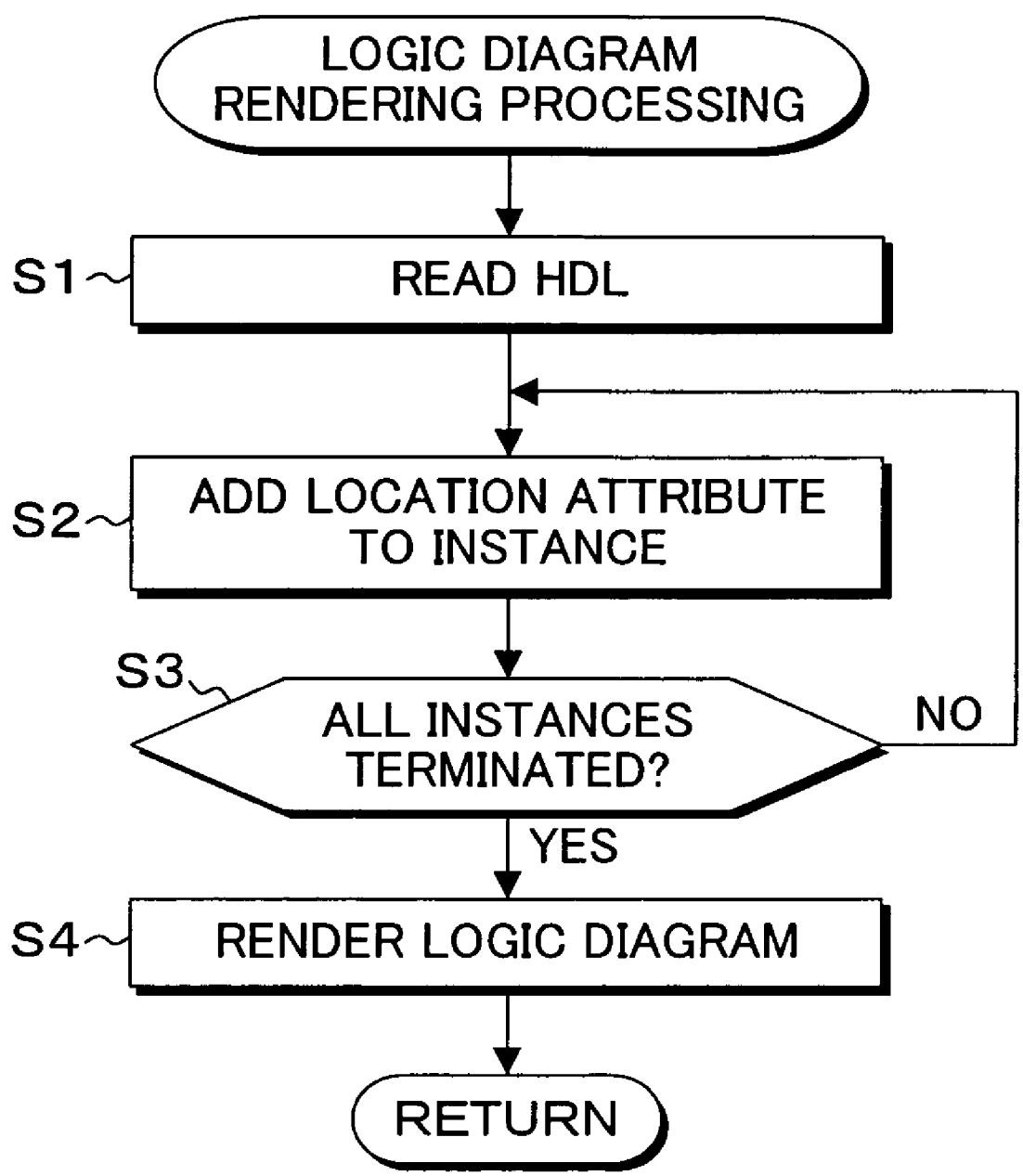
FIG. 11 is a flowchart of logic diagram rendering processing according to the embodiment.

FIG. 11 is a flowchart of logic diagram rendering processing according to the embodiment, representing details in step S4 of FIG. 2. In FIG. 11, in the logic diagram rendering processing, the HDL file 30 is read in step S1 by the HDL read unit 32. Next in step S2, for the HDL files stored in the logic diagram storage 34, location names of the instances are decoded by the location attribute addition unit 36 to add location attributes indicative of locations on the diagram. In step S3, when addition of the location attributes to all instances in step S2 is completed, logic diagram rendering is performed in step S4 by the logic diagram output unit 38 for rendering instances at locations based on the location attributes. Such logic diagram rendering processing of the present embodiment is described in further detail as follows. First, the HDL read unit 32 of FIGS. 10A and 10B are assumed to read, for example, the HDL file 30 as shown in FIG. 12. The HDL file 30 of FIG. 12 has a module name of "exam1" in the first row, and then has four port names described therein. The second to fifth rows have port declarations. The sixth to seventh rows have wire declarations. 8 to 10 denote main bodies and, in this case, three instances are described. The location attribute addition unit 36 of FIGS. 10A and 10B add the location attribute for the HDL file of FIG. 12 read by the HDL read unit 32. By taking an instance on the eighth row in the HDL file 30 as an example, the processing is as follows.

(1) First three letters of the instance name are taken as a page name, and this page name is added as an attribute of the instance. In this case, the instance name is "aaa2c", and the first three letters of "aaa" are used as a page name.

(2) The fourth letter of the instance name is taken as a coordinate value on the horizontal axis, and is added to the attribute of the instance. In the case of the instance name of "aaa2c", the fourth letter of "2" is taken as a coordinate value on the horizontal axis.

(3) The fifth letter of the instance name is taken as a coordinate value on the vertical axis, and is added to the attribute of the instance. In the case of the instance name of "aaa2c", the fifth letter of "c" is taken as a coordinate value on the vertical axis.

Similar processing is performed on the instances on the ninth and tenth rows for addition as location attributes. Finally, a logic diagram is displayed by the logic diagram output unit 38 of FIGS. 10A and 10B, as shown in a logic diagram screen 40-1 of FIG. 13, based on the location attributes added to each instance, that is, the page name, the coordinate value on the horizontal axis, and the coordinate value on the vertical axis On the logic diagram screen 40-1, a page name 94 is "aaa", horizontal axis coordinate values 96 are "1 to 5", and vertical axis coordinate values are "a to c". An instance 100 of an inverter circuit, an instance 102 of an AND circuit, and an instance 104 of an XOR circuit are rendered and arranged on the diagram based on the location attributes respectively added thereto.

In FIGS. 14A and 14B, blocks operating as the instance arrangement processing unit 106 in the present embodiment are represented by solid lines, while the other blocks are represented by broken lines. The instance arrangement processing unit 106 is configured of the logic diagram storage unit 34, the logic diagram output unit 38, the instance arrangement unit 42, the location change unit 44, and the HDL output unit 46. Here, the instance arrangement unit 42 performs instance arrangement processing. On the other hand, the location change unit 44 performs instance movement processing.

Figure 15:
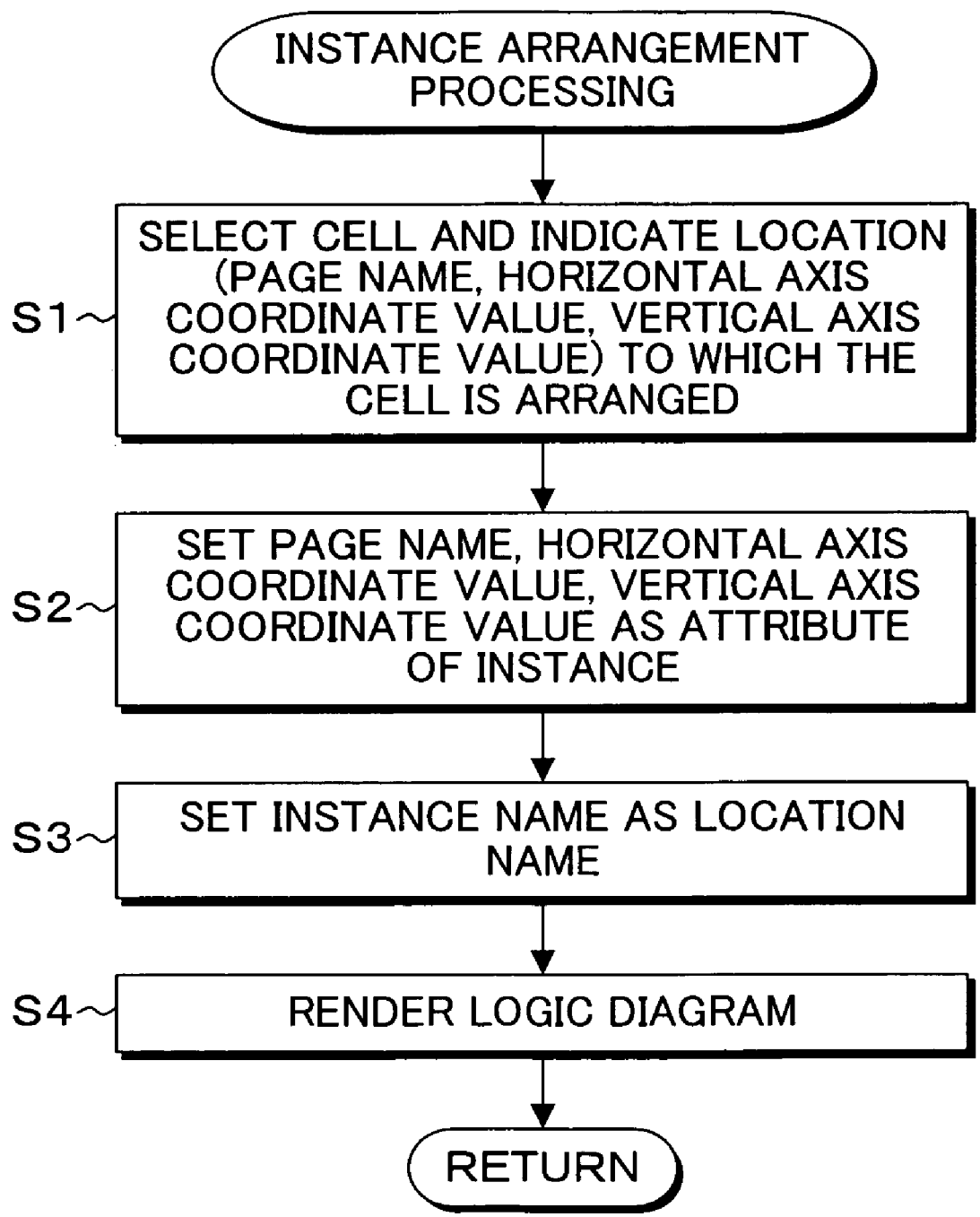
FIG. 15 is a flowchart of instance arrangement processing according to the embodiment.

FIG. 15 is a flowchart of instance arrangement processing in the embodiment, representing details in step S6 of FIG. 2. This instance arrangement processing takes a case as an example where instances are to be arranged on a vacant diagram without a logic diagram rendered. First in step S1, with a vacant diagram being open on the screen, the designer selects a required cell from, for example, the cell retrieval result 90 of FIG. 9 acquired in the cell retrieval processing, and arranges it on the vacant screen. With this cell arrangement, a page name, a vertical axis coordinate value, and a horizontal axis coordinate value are determined as location information. Next in step S2, a page name, a horizontal axis coordinate value, and a vertical axis coordinate value are set as attributes of the instance determined by the cell arrangement. The location name is a name in combination of the page name, the horizontal axis coordinate value, and the vertical axis coordinate value. Then in step S4, the instance is displayed on the screen as a logic circuit. Furthermore, as required, an HDL file corresponding to the logic diagram with instance arrangement having been completed is outputted by the HDL output unit 46. This instance arrangement processing is described in further detail as follows.

Figure 13:
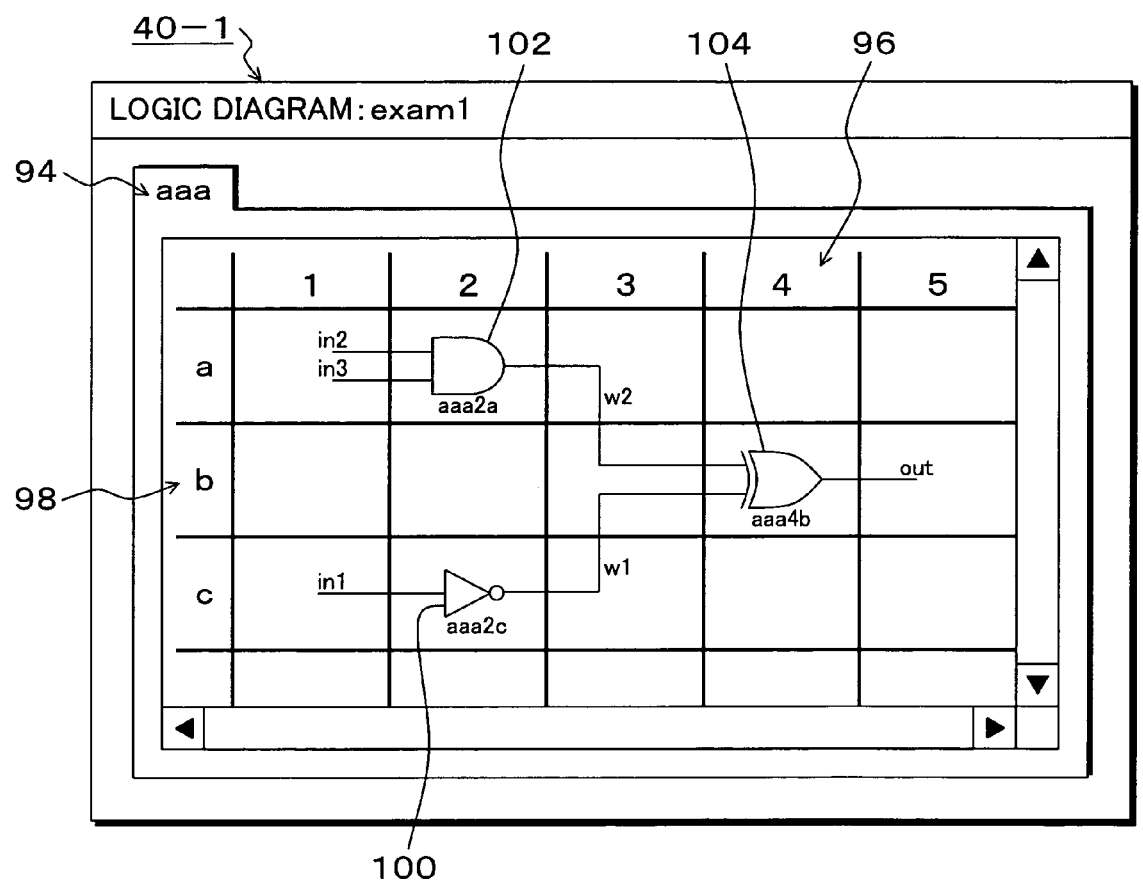
FIG. 13 is an explanatory diagram of a logic diagram screen in FIGS. 10A and 10B.
Figure 16A:
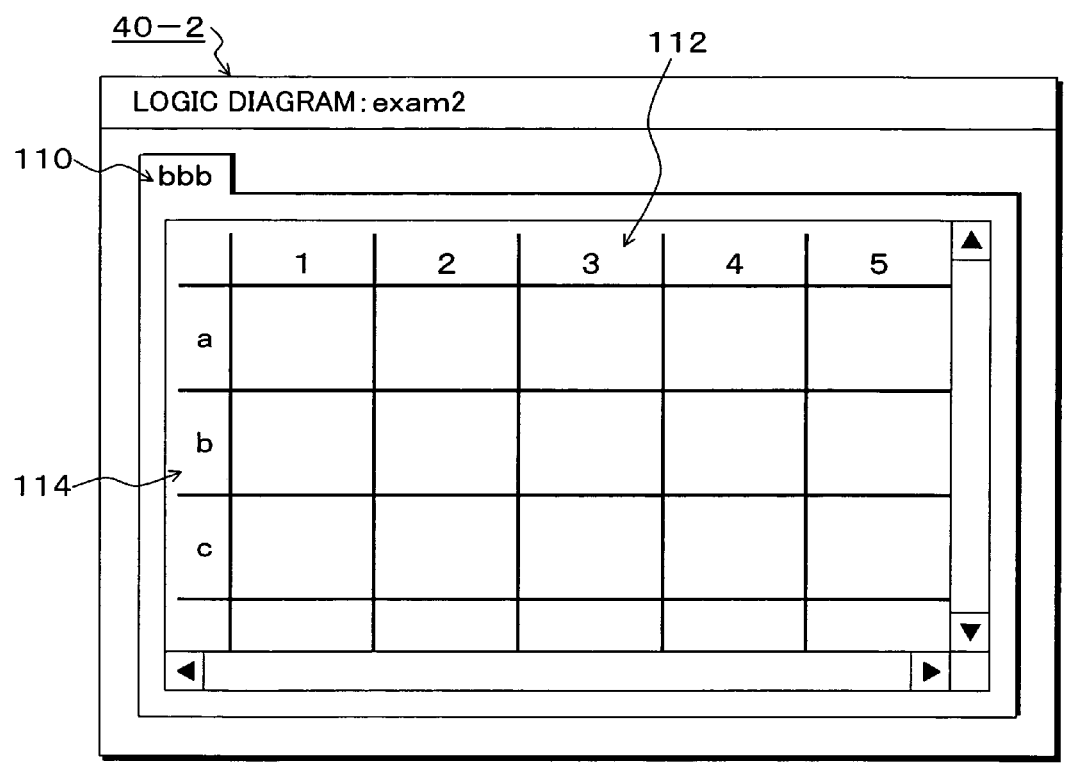
FIGS. 16A to 16C are explanatory diagrams of logic diagram screens where instances in FIGS. 14A and 14B are arranged and the HDL file to be outputted.
Figures 16B, 16C:
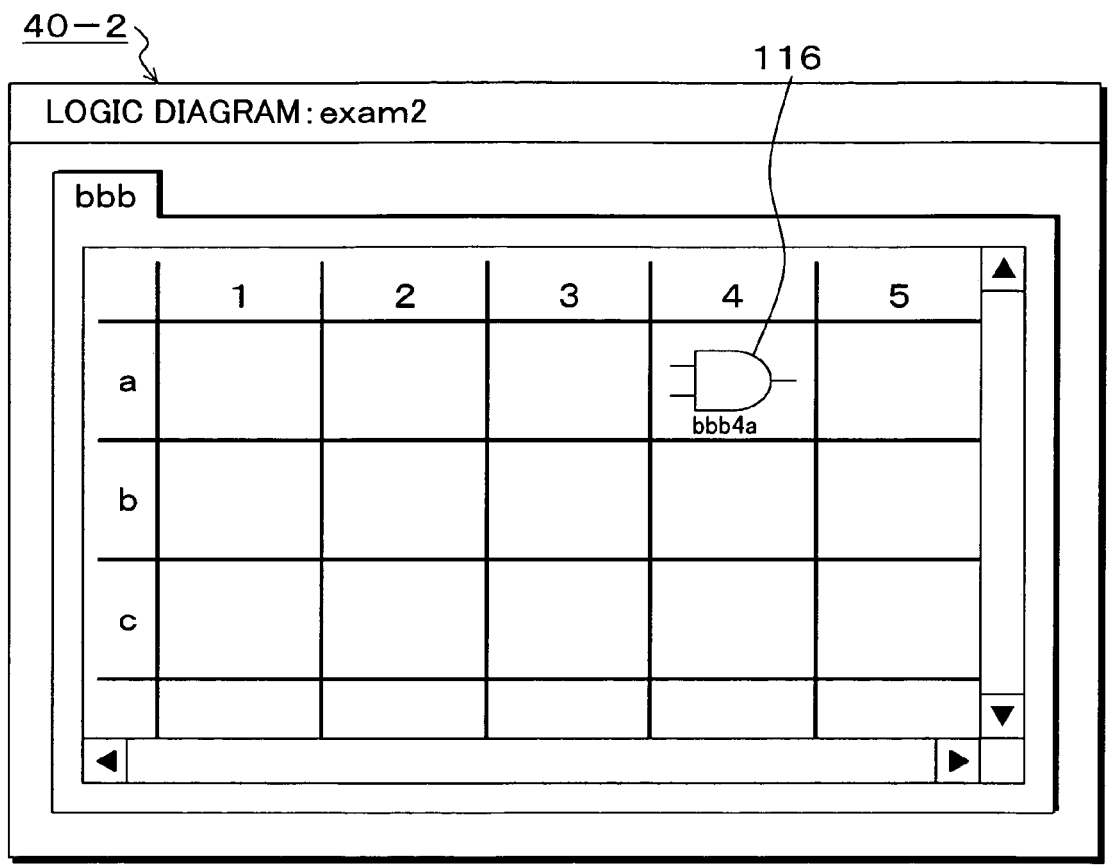

FIG. 16A displays a vacant diagram as a logic diagram screen 40-2, where an instance is assumed to be arranged. A module name on the logic diagram screen 40-2 is "exam2" and, in an initial state, this diagram is a vacant diagram with no instance arrangement. In this state, a cell is selected by the instance arrangement unit 42, and its location is specified. In this example, it is assumed that "and1b" is selected as a cell and the page name=bbb, the horizontal axis coordinate value=4, and a vertical axis coordinate value=a are specified as a location. With this, as attributes of an instance, the page name is set as "bbb", the horizontal axis coordinate value is set as "4", and the vertical axis coordinate value is set as "a". Then, the page name, the horizontal axis coordinate value, and the vertical axis coordinate value set as attribute of the instance are combined to generate a location name. In this case, the location name is set as "bbb4a". Upon generation of the location name, this location name is set as an instance name of "bbb4a". Then, based on the location attribute of the instance, the logic diagram output unit 38 causes an instance 116 to be displayed at the specified location, as shown in FIG. 16B. Finally, the HDL output unit 46 outputs an HDL file 48 of FIG. 16C based on the logic diagram of the instance 116 of FIG. 16B. In this HDL file 48, only the instance is described on the second row, and the instance name of "bbb4a" is the location name. Here, although FIGS. 16A to 16C take the case of arranging an instance on a vacant screen as an example, as shown in FIG. 13, the instance processing of the present embodiment can be applied similarly even when an instance is arranged on a logic diagram rendered from the read HDL file by the HDL read unit 32 of FIGS. 10A and 10B. In this case, processing is such that a new instance is added to the logic diagram rendered by reading the HDL file.

Figure 17:
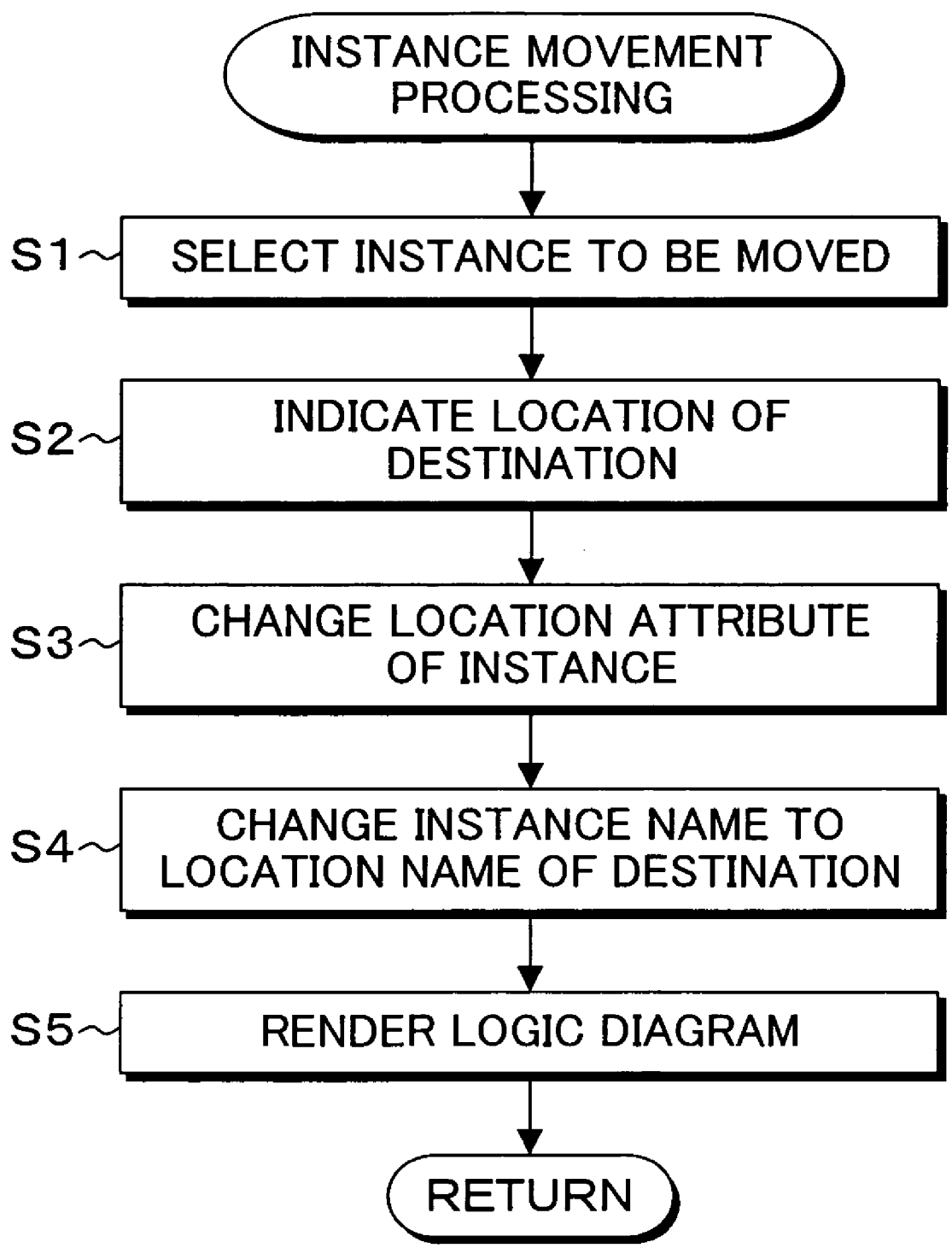
FIG. 17 is a flowchart of instance movement processing according to the embodiment.
Figure 18A:
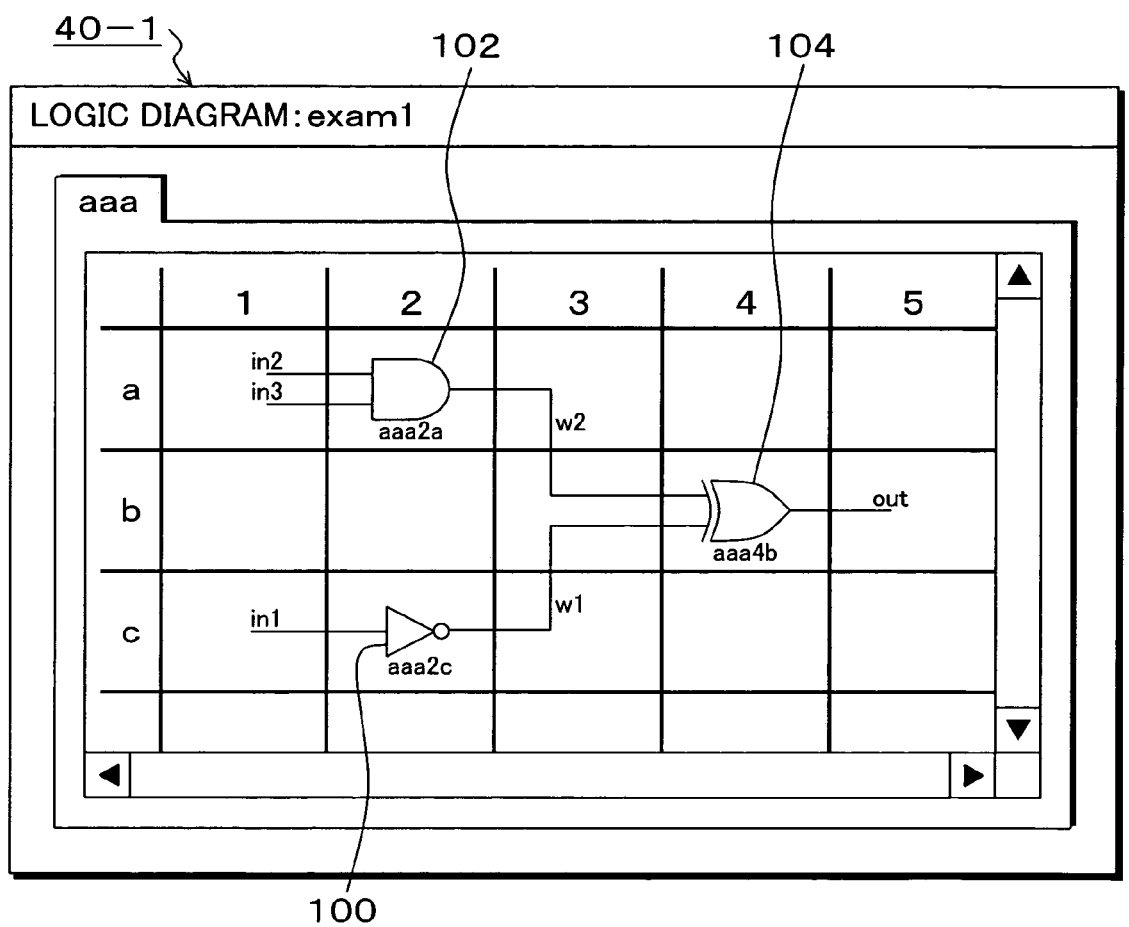
FIGS. 18A and 18B are explanatory diagrams of logic diagram screens before movement and after movement of instance in FIGS. 14A and 14B.
Figure 18B:
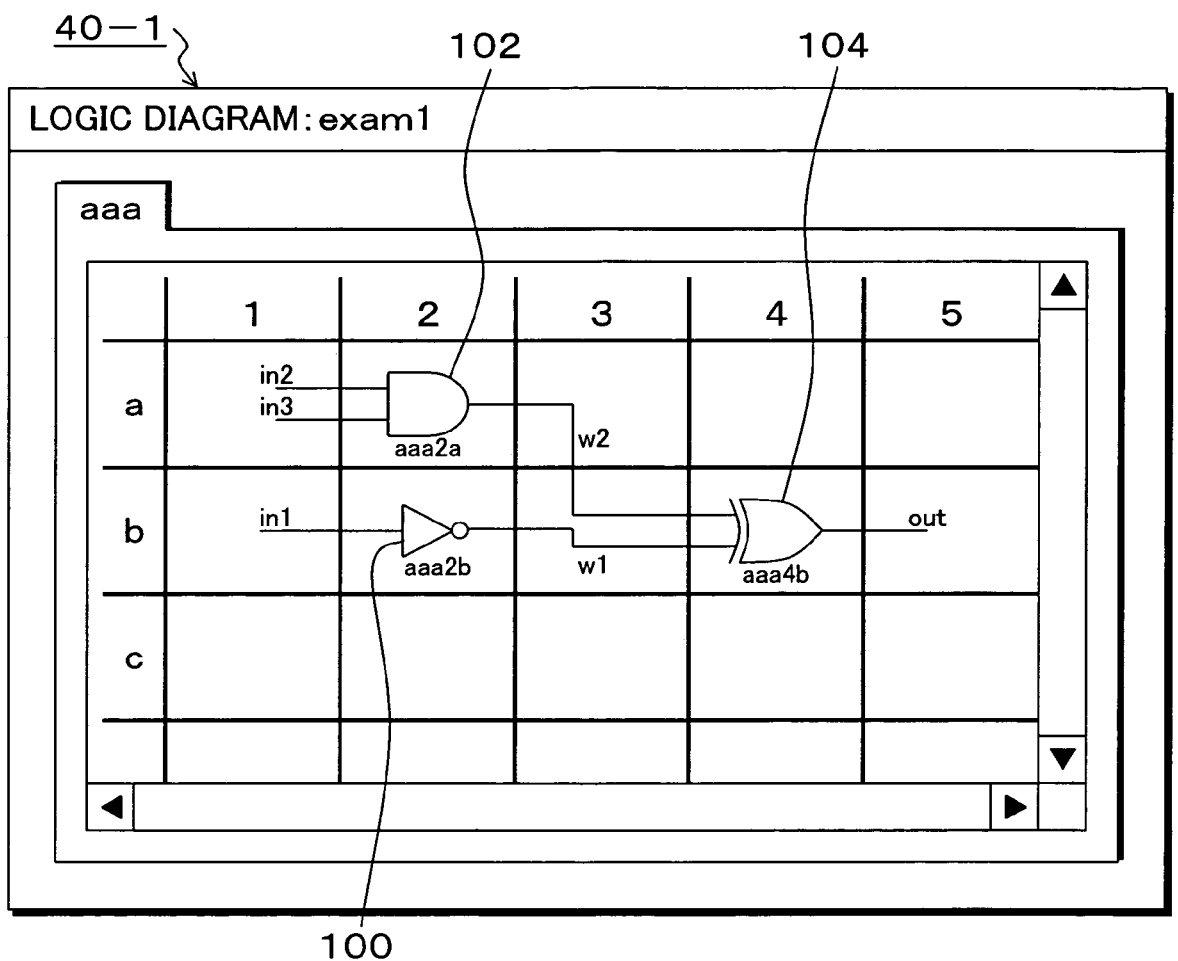

FIG. 17 is a flowchart of instance movement processing in the embodiment to be performed by the location change unit 44 of FIGS. 14A and 14B, representing details in step S8 in FIG. 2. In the instance movement processing, an instance to be moved is selected from among the logic diagram displayed on the screen in step S1. Next, when a location of a destination is specified in step S2 on the diagram, the location attribute of the instance is changed from the location attribute before movement to a location attribute at the destination. Then in step S4, the instance name is changed to a location name at the destination, and a logic diagram is rendered in step S5 on the diagram after movement and is outputted as a function description file (HDL file) as required. The instance movement processing of the present invention is described in detail as follows. FIG. 18A depicts a logic diagram screen 40-1 before instance movement, which is identical to the logic diagram screen rendered by reading the HDL file shown in FIG. 13. In FIG. 18A, the case is described where an instance 100 with an instance name of "aaa2c" is moved to (horizontal axis coordinate, vertical axis coordinate)=(2, b) on the same page. In this case, a location attribute of (2, c) of the instance 100 before movement is changed by the location change unit 44 to a location attribute of (2, b) at the destination. Then, the horizontal axis coordinate value and the vertical axis coordinate value after page-name movement of the instance 100 are combined to generate a location name after movement. In this case, since a location name before movement is "aaa2c", "aaa2b" is generated as a location name after movement. The instance name is then changed to "aaa2b". Next, when a logic diagram is displayed by the logic diagram output unit 38 as shown in FIG. 18B, the instance 100 before movement is arranged at a destination location of (2, b) for rendering. Based on such a logic diagram after instance movement of FIG. 18B, an HDL file 48 is outputted by the HDL output unit 46 of FIGS. 14A and 14B, and is as shown in FIG. 19. In an HDL file 48 of FIG. 19, the instance name of "aaa2c" on the eighth row in the function description file (HDL file) before change shown in FIG. 12 is changed to the instance name of "aaa2b" in the HDL file 48 of FIG. 19.

In FIGS. 20A and 20B, blocks operating as the attribute display processing unit 120 in the present embodiment are represented by solid lines, while the other blocks are represented by broken lines. The attribute display processing unit 120 includes the logic diagram storage unit 34, the logic diagram output unit 38, a slack value read unit 52, and a wiring length read unit 56.

Figure 21:
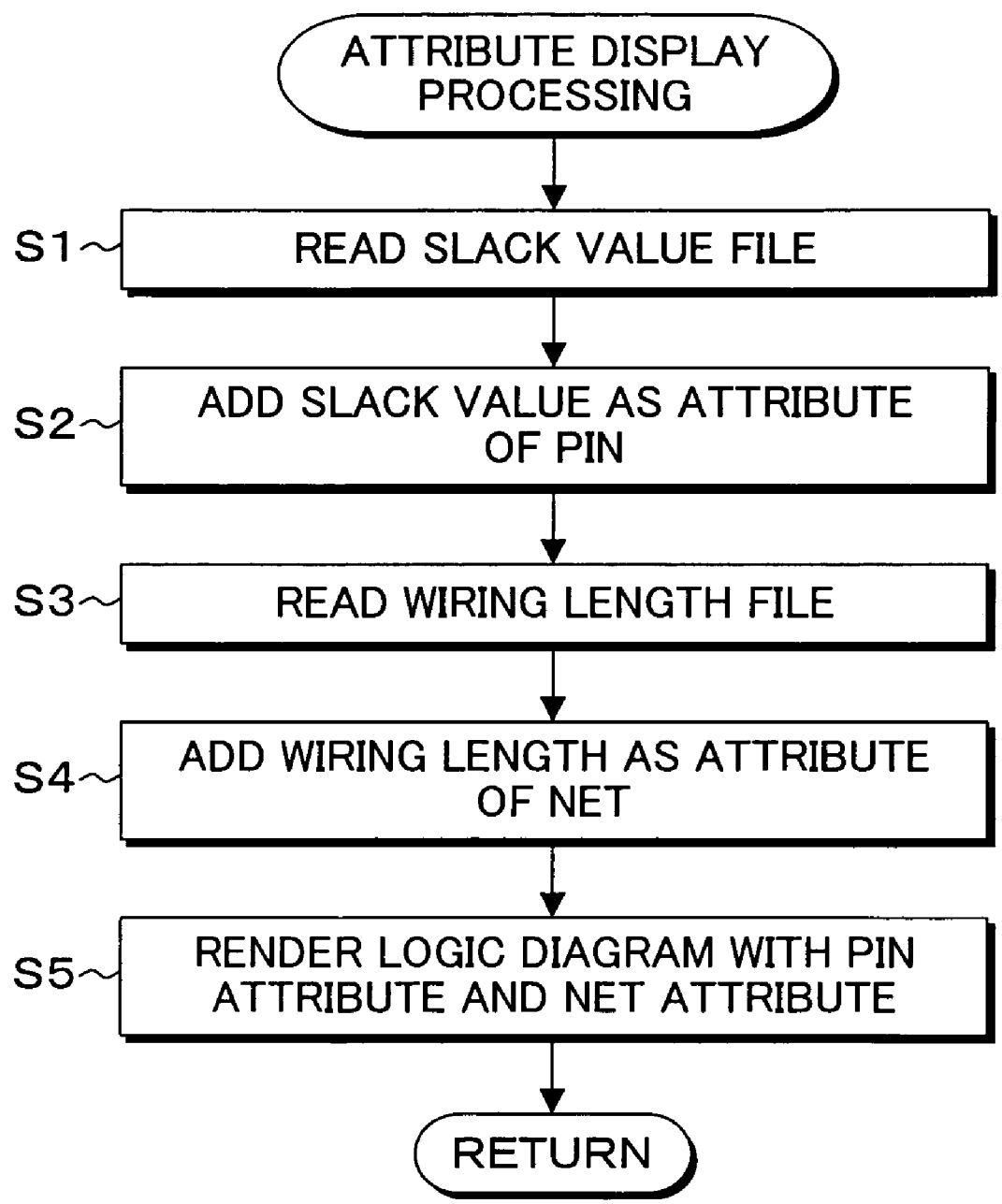
FIG. 21 is a flowchart of attribute display processing according to the embodiment.
Figure 22A:
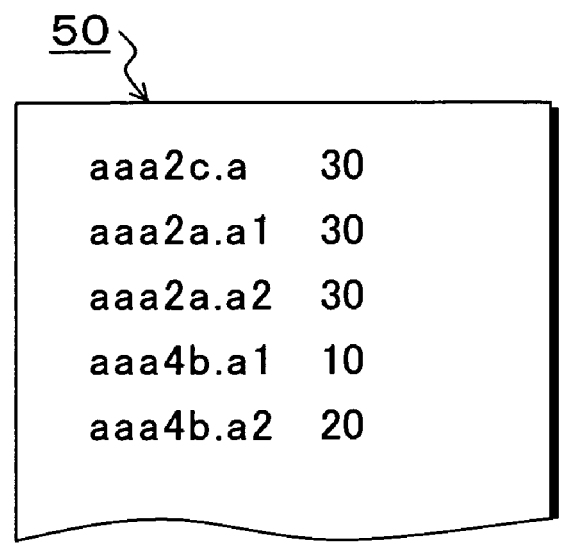
FIGS. 22A and 22B are explanatory diagram of a slack value file and a wiring length file in FIGS. 20A and 20B.
Figure 22B:
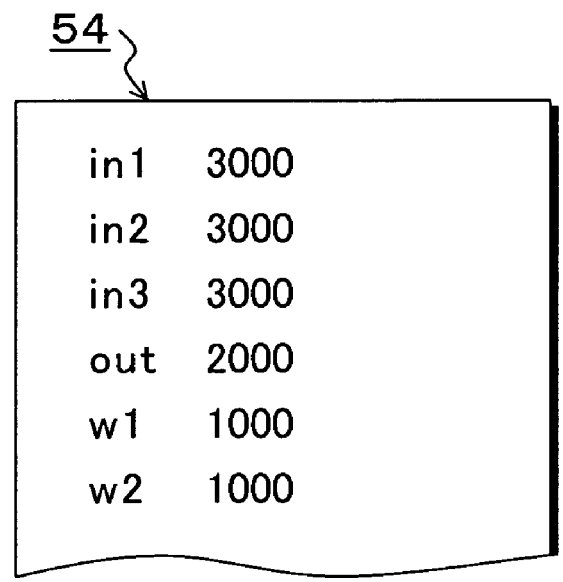
Figure 23:
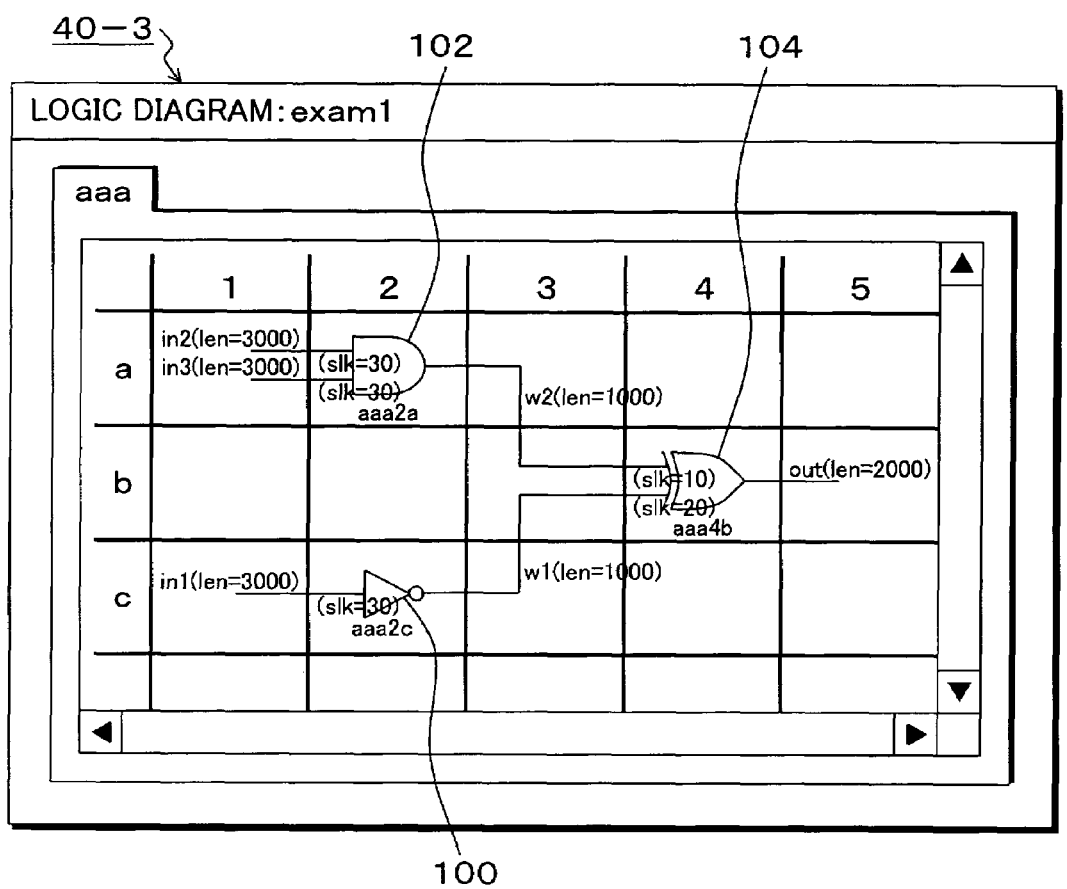
FIG. 23 is an explanatory diagram of a logic diagram screen showing attributes according to the embodiment.

FIG. 21 is a flowchart of attribute display processing according to the present embodiment, representing details in step S1 of FIG. 2. In this attribute display processing, the slack value read unit 52 reads a slack value file 50 in step S1, and adds a slack value as an attribute of a pin in step S2. Next, in step S3, the wiring length read unit 56 reads a wiring length file 54, and adds a wiring length as an attribute of a net in step S4. Finally in step S5, the logic diagram output unit 38 renders a logic diagram with the slack value, which is the attribute of the pin, and the wiring length, which is the net attribute, being displayed near the pin and the net, respectively on the logic diagram. The attribute display processing is described in further detail as follows. The slack value read unit 52 of FIGS. 20A and 20B read, for example, the slack value file 50 shown in FIG. 22A for addition as an attribute of a pin. Here, the slack value is a value indicative of how much degree a margin with respect to a required timing is present. A positive slack value indicates that the required timing is satisfied. A negative slack value indicates that timing violation is included. In the slack value file 50 of FIG. 22A, for example, slack values are set for input pins of instances on eighth to tenth rows of the read HDL file 30 shown in FIG. 12. Such slack values are generated with the HDL file being converted to a net list by using a logic synthesis tool, and are used for verification and change of the logic diagram. Also, the wiring length read unit 56 of FIGS. 20A and 20B read, for example, the wiring length file 54 shown in FIG. 22B for addition as an attribute of a net. This wiring length file 54 is generated from a net list based on a layout design for the ports in the port declaration on the first row and the nets in the wire declarations on the sixth and seventh rows of the HDL file 30 shown in FIG. 12. After the slack value file 50 of FIG. 22A and the wiring length file 54 of FIG. 22A are read for addition to the pins and nets as attributes, as shown in a logic diagram screen 40-3 of FIG. 23, by the logic diagram output unit 38, the slack values are displayed near the pins on the logic diagram, and the wiring lengths are displayed near the nets. For example, near an input pin of an inverter circuit 100, a slack value (slk=30) is displayed. Also, near a net "in1" of the input of the instance 100 of the inverter circuit 100, a wiring length (len=3000) is displayed. In this manner, when a logic diagram is rendered, the slack value of the pin and the wiring length of the net are read for display near the diagram, thereby allowing the designer to make an appropriate change on the logic diagram in consideration of layout restrictions and others. Also, the present embodiment provides a program having the contents represented by the flowcharts depicted in FIGS. 2, 5, 11, 15, 17, and 21. As this program, in the entire flowchart of FIG. 2, the cell retrieval processing, the logic diagram rendering processing, the instance arrangement processing, the instance movement processing, and the attribute display processing are provided as a series of processing procedures. Alternatively, they may be taken as independent programs for the respective processing. Furthermore, the present embodiment provides a computer-readable recording medium having stored therein a program of performing logic diagram display processing based on the flowcharts depicted in FIGS. 2, 5, 11, 15, 17, and 21. As the recoding medium, portable recording media, such as a floppy disk (R), a DVD disk, a magneto-optical disk, and IC card, storage devices, such as a hard disk drive provided inside or outside of a computer system, as well as a database retaining a program via a line or other computer systems and their databases, and further a transmission medium over the line are included. Here, although Verilog-HDL is taken as an example of the hardware description language in the above embodiment, another hardware description language, for example, VHDL, can be applied basically in the same manner. Also, the present invention is not restricted to the above embodiment, includes appropriate modifications without impairing purposes and advantages of the present invention and, furthermore, is not restricted by numerical values shown in the present embodiment.

What is claimed is:

1. A logic diagram display method of displaying a logic diagram on a screen for processing, including:
   a logic diagram rendering step of rendering the logic diagram on the screen by inputting a function description file (HDL file) of a circuit module described in a hardware description language (HDL);
   a cell retrieval step of retrieving a cell to be arranged on a screen-displayed logic diagram from a library;

an instance arrangement step of arranging on the screen-displayed logic diagram an instance obtained by componentizing the circuit module;

an instance movement step of moving the instance on the screen-displayed logic diagram to a specified location; and a file output step of outputting a function description file (HDL file) for a circuit module corresponding to the screen-displayed logic diagram.

2. The logic diagram display method according to claim 1, wherein the cell retrieval step includes:

a cell list acquirement step of acquiring a cell list from the library;

a classification file read step of reading a classification file corresponding to the cell list;

a classification screen display step of displaying a classification screen of setting a cell retrieval condition based on the classification file; and a cell retrieval step of retrieving from the cell list a cell satisfying the cell retrieval condition set through the classification screen.

3. The logic diagram display method according to claim 2, wherein in the cell list acquirement step, a cell list in which a cell name is formed by hierarchically combining a plurality of cell classification items is acquired from the library, in the classification file read step, a classification file including group types obtained by classifying the cell classification items of the cell names by layer and a conditional expression for cell retrieval generated for each of the group types read, in the classification screen display step, the cell classification items are displayed by each of the group types as the classification screen and a selection operation unit is displayed for each of the cell classification items, and in the cell retrieval step, a plurality of cell classification items selected from the classification screen are set to the conditional expression, and a cell name satisfying the conditional expression is retrieved from the cell list for output.

4. The logic diagram display method according to claim 3, wherein in the cell retrieval step, a cell name hierarchically including the cell classification items set to the conditional expression for each group type is retrieved from the cell list.

5. The logic diagram display method according to claim 1, wherein the logic diagram rendering step includes:

a file read step of reading a function description file (HDL file) using a location name as an instance name of the instance;

a location attribute addition step of decoding the location name of the instance and adding a location attribute indicative of a location on the logic diagram to the instance; and a diagram rendering step of rendering the logic diagram based on the location attribute.

6. The logic diagram display method according to any of claims 5, wherein the location name is represented by alphanumeric characters by combining a page name, a horizontal axis coordinate value, and a vertical axis coordinate value of the logic diagram for screen display.

7. The logic diagram display method according to claim 1, wherein the instance arrangement step includes:

a cell selection step of selecting a cell;

an arrangement location specifying step of specifying an arrangement location of the instance;

a location attribute set step of setting a location attribute of the instance;

a location name set step of setting an instance name as a location name indicative of the specified arrangement location; and a rendering step of rendering the instance at the specified arrangement location.

8. The logic diagram display method according to claim 7, wherein the location name is represented by alphanumeric characters by combining a page name, a horizontal axis coordinate value, and a vertical axis coordinate value of the diagram for screen display.

9. The logic diagram display method according to claim 1, wherein the instance movement step includes:

an instance selection step of selecting an instance to be in moving;

a movement location specifying step of specifying a movement location of the instance;

a location attribute change step of changing a location attribute of the instance;

an instance name change step of changing an instance name to a location name indicative of the specified movement location; and a rendering step of rendering the instance at the specified movement location.

10. The logic diagram display method according to claim 9, wherein the location name is represented by alphanumeric characters by combining a page name, a horizontal axis coordinate value, and a vertical axis coordinate value of the diagram for screen display.

11. The logic diagram display method according to claim 1, further including an attribute display step of reading attributes of pins and nearby nets for display.

12. The logic diagram display method according to claim 11, wherein in the attribute display step, reading a slack value file, adding a slack value as an attribute of a pin, and displaying the slack value near the pin; and reading a wiring length file, adding a wiring length as an attribute of a net, and displaying the wiring length near the net.

13. A logic diagram display method of retrieving a cell to be arranged on a logic diagram displayed on a screen from a library, including:

a cell list acquirement step of acquiring a cell list from the library;

a classification file read step of reading a classification file corresponding to the cell list;

a classification screen display step of displaying a classification screen of setting a cell retrieval condition based on the classification file; and a cell retrieval step of retrieving from the cell list a cell satisfying the cell retrieval condition set through the classification screen.

14. The logic diagram display method according to claim 13, wherein in the cell list acquirement step, a cell list in which a cell name is formed by hierarchically combining a plurality of cell classification items is acquired from the library, in the classification file read step, a classification file including group types obtained by classifying the cell classification items of the cell names by layer and a conditional expression for cell retrieval generated for each of the group types read, in the classification screen display step, the cell classification items are displayed by each of the group types as the classification screen and a selection operation unit is displayed for each of the cell classification items, and in the cell retrieval step, a plurality of cell classification items selected from the classification screen are set to the conditional expression, and a cell name satisfying the conditional expression is retrieved from the cell list for output.

15. A logic diagram display method of inputting a function description file (HDL file) of a circuit module described in a hardware description language (HDL) and displaying a logic diagram on a screen, including:
- a file read step of reading a function description file (HDL file) using a location name as an instance name of an instance obtained by componentizing the circuit module;
- a location attribute addition step of decoding the location name of the instance and adding a location attribute indicative of a location on the diagram to the instance; and
- a logic diagram rendering step of rendering a the logic diagram based on the location attribute.

16. A logic diagram display method of arranging an instance obtained by componentizing a module and rendering a logic diagram on a screen, including:
- a cell selection step of selecting a cell;
- an arrangement location specifying step of specifying an arrangement location of the instance;
- a location attribute set step of setting a location attribute of the instance;
- a location name set step of setting an instance name as a location name indicative of the specified arrangement location; and
- a rendering step of rendering the instance at the specified arrangement location.

17. The logic diagram display method according to claim 16, further including:
- an instance selection step of selecting an instance to be moved;
- a movement location specifying step of specifying a movement location of the instance;
- a location attribute change step of changing a location attribute of the instance;
- an instance name change step of changing an instance name to a location name indicative of the specified movement location; and
- a rendering step of rendering the instance at the specified movement location.

18. A computer-readable storage medium which stores a program causing a computer to execute:
- a logic diagram rendering step of rendering a logic diagram on a screen by inputting a function description file (HDL file) of a circuit module described in a hardware description language (HDL);
- a cell retrieval step of retrieving a cell to be arranged on the screen-displayed logic diagram from a library;
- an instance arrangement step of arranging on the screen-displayed logic diagram an instance obtained by componentizing the circuit module;
- an instance movement step of moving the instance on the screen-displayed logic diagram to a specified location; and
- a file output step of outputting a function description file (HDL file) for a circuit module corresponding to the screen-displayed logic diagram.

19. The storage medium according to claim 18, wherein cell retrieval step includes:
- a cell list acquirement step of acquiring a cell list from the library;
- a classification file read step of reading a classification file corresponding to the cell list;
- a classification screen display step of displaying a classification screen of setting a cell retrieval condition based on the classification file; and
- a cell retrieval step of retrieving from the cell list a cell satisfying the cell retrieval condition set through the classification screen.

20. The storage medium according to claim 19, wherein
in the cell list acquirement step, a cell list in which a cell name is formed by hierarchically combining a plurality of cell classification items is acquired from the library,
in the classification file read step, a classification file including group types obtained by classifying the cell classification items of the cell names by layer and a conditional expression for cell retrieval generated for each of the group type is read,
in the classification screen display step, the cell classification items are displayed by each of the group types as the classification screen and a selection operation unit is displayed for each of the cell classification items, and
in the cell retrieval step, a plurality of cell classification items selected from the classification screen are set to the conditional expression, and a cell name satisfying the conditional expression is retrieved from the cell list for output.

21. The storage medium according to claim 18, wherein the logic diagram rendering step includes:
- a file read step of reading a function description file (HDL file) using a location name as an instance name of the instance;
- a location attribute addition step of decoding the location name of the instance and adding a location attribute indicative of a location on the logic diagram to the instance; and
- a diagram rendering step of rendering the logic diagram based on the location attribute.

22. The storage medium according to claim 18, wherein the instance arrangement step includes:
- a cell selection step of selecting a cell;
- an arrangement location specifying step of specifying an arrangement location of the instance;
- a location attribute set step of setting a location attribute of the instance;
- a location name set step of setting an instance name as a location name indicative of the specified arrangement location; and
- a rendering step of rendering the instance at the specified arrangement location.

23. The storage medium according to claim 18, wherein the instance movement step includes:
- an instance selection step of selecting an instance to be in moving;
- a movement location specifying step of specifying a movement location of the instance;
- a location attribute change step of changing a location attribute of the instance;
- an instance name change step of changing an instance name to a location name indicative of the specified movement location; and
- a rendering step of rendering the instance at the specified movement location.

24. The storage medium according to claim 18, further including an attribute display step of reading attributes of pins and nearby nets for display.

25. A logic diagram display apparatus in which a logic diagram is displayed on a screen for processing, including:

a logic diagram rendering unit that renders the logic diagram on the screen by inputting a function description file (HDL file) of a circuit module described in a hardware description language (HDL);

a cell retrieval unit that retrieves a cell to be arranged on the screen-displayed logic diagram from a library;

an instance arrangement unit that arranges on the screen-displayed logic diagram an instance obtained by componentizing the circuit module;

an instance movement unit that moves the instance on the screen-displayed logic diagram to a specified location; and a file output unit that outputs a function description file (HDL file) for a circuit module corresponding to the screen-displayed logic diagram.

26. The logic diagram display apparatus according to claim 25, wherein the cell retrieval unit includes:

a cell list acquirement unit that acquires a cell list from the library;

a classification file read unit that reads a classification file corresponding to the cell list;

a classification screen display unit that displays a classification screen of setting a cell retrieval condition based on the classification file; and a cell retrieval unit that retrieves from the cell list a cell satisfying the cell retrieval condition set through the classification screen.

27. The logic diagram display apparatus according to claim 26, wherein the cell list acquirement unit acquires from the library a cell list in which a cell name is formed by hierarchically combining a plurality of cell classification items, the classification file read unit reads a classification file including group types obtained by classifying the cell classification items of the cell names by layer and a conditional expression for cell retrieval generated for each of the group types, the classification screen display unit displays the cell classification items by each of the group types as the classification screen and displays a selection operation unit for each of the cell classification items, and the cell retrieval unit sets a plurality of cell classification items selected from the classification screen to the conditional expression, and retrieves a cell name satisfying the conditional expression from the cell list for output.

28. The logic diagram display apparatus according to claim 25, wherein the logic diagram rendering unit includes:

a file read unit that reads a function description file (HDL file) using a location name as an instance name of the instance;

a location attribute addition unit that decodes the location name of the instance and adds a location attribute indicative of a location on the logic diagram to the instance; and a diagram rendering unit that renders the logic diagram based on the location attribute.

29. The logic diagram display apparatus according to claim 25, wherein the instance arrangement unit includes:

a cell selection unit of selecting a cell;

an arrangement location specifying unit of specifying an arrangement location of the instance;

a location attribute set unit of setting a location attribute of the instance;

a location name set unit of setting an instance name as a location name indicative of the specified arrangement location; and a rendering unit of rendering the instance at the specified arrangement location.

30. The logic diagram display apparatus according to claim 25, wherein the instance movement unit includes:

an instance selection unit of selecting a moving instance;

a movement location specifying step of specifying a movement location of the instance;

a location attribute change unit of changing a location attribute of the instance;

an instance name change unit of changing an instance name to a location name indicative of the specified movement location; and a rendering unit of rendering the instance at the specified movement location.

31. The logic diagram display apparatus according to claim 25, further including an attribute display unit that reads attributes of pins and nearby nets for display.

* * * * *

UNITED STATES PATENT AND TRADEMARK OFFICE
CERTIFICATE OF CORRECTION

PATENT NO. : 7,634,750 B2
APPLICATION NO. : 11/543029
DATED : December 15, 2009
INVENTOR(S) : Eiji Furukawa It is certified that error appears in the above-identified patent and that said Letters Patent is hereby corrected as shown below:

Column 1, Line 5, change "JP 2006-161916," to --JP 2006-179016,--.

Column 1, Line 5, change "Jun. 12, 2006," to --Jun. 29, 2006,--.

Column 17, Line 18, before "the logic" delete "a".

Signed and Sealed this

Sixteenth Day of March, 2010

David J. Kappos
*Director of the United States Patent and Trademark Office*

UNITED STATES PATENT AND TRADEMARK OFFICE
CERTIFICATE OF CORRECTION

| | | |
|---|---|---|
| PATENT NO. | : 7,634,750 B2 | Page 1 of 1 |
| APPLICATION NO. | : 11/543029 | |
| DATED | : December 15, 2009 | |
| INVENTOR(S) | : Eiji Furukawa | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 609 days.

Signed and Sealed this

Ninth Day of November, 2010

David J. Kappos
*Director of the United States Patent and Trademark Office*